US012570533B2

(12) United States Patent
Dräger et al.

(10) Patent No.: US 12,570,533 B2
(45) Date of Patent: Mar. 10, 2026

(54) PROCESS FOR PRODUCING SILICON-CONTAINING MATERIALS IN A STIRRED-TANK REACTOR

(71) Applicant: Wacker Chemie AG, Munich (DE)

(72) Inventors: Christoph Dräger, Munich (DE); Moritz Becker, Munich (DE); Michael Fricke, Munich (DE); Alena Kalyakina, Munich (DE); Claudia Kleinlein, Munich (DE); Sebastian Kneissl, Munich (DE); Sebastian Suckow, Munich (DE); Jan Tillmann, Munich (DE)

(73) Assignee: Wacker Chemie AG, Munich (DE)

( * ) Notice: Subject to any disclaimer, the term of this patent is extended or adjusted under 35 U.S.C. 154(b) by 0 days.

(21) Appl. No.: 18/691,509

(22) PCT Filed: Dec. 20, 2021

(86) PCT No.: PCT/EP2021/086900
§ 371 (c)(1),
(2) Date: Mar. 13, 2024

(87) PCT Pub. No.: WO2023/117047
PCT Pub. Date: Jun. 29, 2023

(65) Prior Publication Data
US 2024/0376594 A1 Nov. 14, 2024

(51) Int. Cl.
| | |
|---|---|
| *C23C 16/24* | (2006.01) |
| *C01B 33/027* | (2006.01) |
| *C01B 33/029* | (2006.01) |
| *C23C 16/44* | (2006.01) |
| *C23C 16/442* | (2006.01) |
| *C23C 16/56* | (2006.01) |
| *H01M 4/38* | (2006.01) |

(52) U.S. Cl.
CPC .......... *C01B 33/027* (2013.01); *C01B 33/029* (2013.01); *C23C 16/24* (2013.01); *C23C 16/4417* (2013.01); *C23C 16/442* (2013.01); *C23C 16/56* (2013.01); *H01M 4/386* (2013.01)

(58) Field of Classification Search
CPC ................................................ C23C 16/4417
See application file for complete search history.

(56) References Cited

U.S. PATENT DOCUMENTS

| | | | |
|---|---|---|---|
| 7,658,340 | B2 | 2/2010 | Pfeffer et al. |
| 10,147,950 | B2 | 12/2018 | Sakshaug et al. |
| 10,508,335 | B1 | 12/2019 | Yilmaz et al. |
| 10,559,812 | B2 | 2/2020 | Matsuno et al. |
| 10,819,400 | B2 | 10/2020 | Ma et al. |
| 2020/0240013 | A1 | 7/2020 | Geertsen |

FOREIGN PATENT DOCUMENTS

| | | | |
|---|---|---|---|
| EP | 1730800 | B1 | 5/2008 |
| EP | 2889097 | A1 | 7/2015 |
| EP | 3335262 | B1 | 6/2019 |
| GB | 2580110 | B | 1/2021 |
| JP | 11133674 | A | 5/1999 |
| JP | 2016190749 | A | 11/2016 |

OTHER PUBLICATIONS

M. Obrovac, V.L. Chevrier Chem. Rev. 2014, vol. 114, p. 11444.
F. Schüth: "Heterogene Katalyse." Chem. Unserer Zeit 2006, vol. 40, pp. 92-103 (F. Schüth: "Heterogeneous Catalysis").
VDI-Wärmeatlas, 11. Auflage, Abschnitt L3.2 Strömungsformen und Druckverlust in Wirbelschichten, pp. 1371-1382, Springer Verlag, Berlin Heidelberg, 2013 (VDI Heat Atlas, 11th edition, section L3.2 "Flow forms and pressure loss in fluidized beds").
Shabanian, J.; Jafari, R.; Chaouki, J.: "Fluidization of Ultrafine Powders." IRECHE., vol. 4, No. 1, pp. 16-50.
Cadoret, L.; Reuge, N.; Pannala, S.; Syamlal, M.; Rossignol, C.; Dexpert-Ghys, J.; Coufort, C.; Caussat, B.: "Silicon Chemical Vapor Deposition on macro and submicron powders in a fluidized bed." Powder Technol., vol. 190, pp. 185-191, 2009.
M. Mueller: "Feststoffmischen." Chemie Ingenieur Technik 2007, vol. 79, No. 7, pp. 1015-1023 (M. Mueller: "Solids Mixing").
D. Geldart: "Types of gas fluidization." Powder Technology 7 (1973), p. 285.

*Primary Examiner* — Austin Murata

(57) ABSTRACT

A process for producing silicon-containing materials. Where the silicon-containing materials are produced by thermal decomposition of silicon precursors in the presence of porous particles and silicon is deposited within pores and on a surface of the porous particles. The thermal decomposition of the silicon precursors takes place in the reaction zone of a gas-traversed reactor and the particles are circulated in the reaction zone during the thermal decomposition by using a stirrer which is close-clearance in the heated regions and the stirring mechanism is in close-clearance in accordance with equation 1

$$W(h) = \frac{u_R(h)}{u_B(h)}. \tag{1}$$

9 Claims, No Drawings

PROCESS FOR PRODUCING SILICON-CONTAINING MATERIALS IN A STIRRED-TANK REACTOR

CROSS-REFERENCE TO RELATED APPLICATIONS

This application is a U.S. National Phase application of PCT Application NO. PCT/EP2021/086900 filed on Dec. 20, 2021, which is incorporated by reference herein in their entirety.

A process for producing silicon-containing materials by thermal decomposition of silicon precursors in the presence of porous particles, where silicon is deposited in pores and on the surface of the porous particles in a gas-traversed reactor with a close-clearance stirrer; the silicon-containing materials obtainable by the process; and anode materials, anodes and lithium-ion batteries containing the silicon-containing materials.

As storage media for electrical power, lithium-ion batteries are presently the most practical electrochemical energy stores having the highest energy densities. Lithium-ion batteries are utilized primarily in the area of portable electronics, for tools, and also for electrically driven transportation means, such as bicycles, scooters or automobiles. A widespread active material presently for the negative electrode ("anode") of corresponding batteries is graphitic carbon. A disadvantage, however, is the relatively low electrochemical capacity of such graphitic carbons, which is theoretically at most 372 mAh per gram of graphite and therefore corresponds only to about a tenth of the electrochemical capacity theoretically achievable with lithium metal. Alternative active materials for the anode use an addition of silicon, as described for example in EP 1730800 B1, in U.S. Pat. No. 10,559,812 B2, in U.S. Pat. No. 10,819,400 B2, or in EP 3335262 B1. Silicon with lithium forms binary, electrochemically active alloys which enable very high electrochemically achievable lithium contents of up to 3579 mAh per gram of silicon [M. Obrovac, V. L. Chevrier *Chem. Rev.* 2014, 114, 11444].

The intercalation and deintercalation of lithium ions in silicon is associated with the disadvantage of an accompanying very sharp change in volume, which in the case of complete intercalation can reach up to 300%. Such changes in volume subject the silicon-containing active material to severe mechanical loading, possibly resulting in the active material ultimately breaking apart. In the active material and in the electrode structure, this process, also referred to as electrochemical grinding, leads to a loss of electrical contacting and hence to the sustained, irreversible loss of capacity of the electrode.

Additionally, the surface of the silicon-containing active material reacts with constituents of the electrolyte to form, continuously, passivating protective layers (solid electrolyte interphase; SEI). The components formed are no longer electrochemically active. The lithium bound within them is no longer available to the system, so leading to a pronounced and continuous loss of capacity of the battery. Because of the extreme change in volume of the silicon during battery charging/discharging, the SEI regularly breaks up, meaning that further, as yet unoccupied surfaces of the silicon-containing active material are exposed, and are then subject to further SEI formation. Since the amount of mobile lithium in the complete cell, which corresponds to the useful capacity, is limited by the cathode material, it is increasingly consumed, and the capacity of the cell after just a few cycles drops to an extent unacceptable from a performance standpoint.

The reduction in capacity in the course of multiple charging and discharging cycles is also referred to as fading or continuous capacity loss, and is generally irreversible.

As active materials for anodes of lithium-ion batteries, a series of silicon-carbon composite particles have been described, in which the silicon is incorporated into porous carbon particles starting from gaseous or liquid precursors.

It is general knowledge that in multiphase reaction systems, good contacting of the porous solid with the fluid precursor is necessary [F. Schüth Chem. Unserer Zeit 2006, 40, 92-103].

For example, U.S. Pat. No. 10,147,950 B2 describes the deposition of silicon from monosilane $SiH_4$ in a porous carbon in a rotary tube furnace or comparable furnace type at elevated temperatures of 300 to 900° C., preferably with agitation of the particles, through a process of CVD (chemical vapor deposition) or PE-CVD (plasma-enhanced chemical vapor deposition). This process employs a mixture of 2 mol % of monosilane with nitrogen as inert gas. As a result of the low concentration of the silicon precursor in the gas mixture, the reaction times are very long. Moreover, the ratio of particle bed to reactor volume in a rotary tube furnace is usually very unfavorable, since otherwise there is considerable discharge of particles by the gas stream.

Another method of carrying out gas-solid reactions and hence also for the operation of incorporating silicon into porous starting materials involves gas-fluidized beds. In a gas-fluidized bed, a bed of solid particles is loosened and carried by an upward flow of gas so extensively that the bed of solids as a whole exhibits liquidlike behavior [VDI-Wärmeatlas 11th edition, section L3.2 Flow forms and pressure loss in fluidized beds, pp. 1371-1382, Springer Verlag, Berlin Heidelberg, 2013].

Gas-fluidized beds are also referred to generally as fluidized beds. The procedure for generating a fluidized bed is also referred to as fluidization or fluidizing.

In a gas-fluidized bed, the solid particles are very well-dispersed. Consequently, a very large contact area is formed between solid and gas, which can be utilized ideally for energy and mass transfer processes. Gas-fluidized beds are characterized generally by very good mass and heat transfer events and by a uniform temperature distribution. The quality of the mass and heat transfer processes is critical particularly to the homogeneity of products obtained by reactions in fluidized beds, and can be correlated with the homogeneity of the state of fluidization. Consequently, the formation of a homogeneous fluidized bed or homogeneous state of fluidization is essential for the utilization of the fluidized bed process for the production of products having uniform product properties.

The fluidization properties can be classified as a function of the particle size and the solids density of the particles. For example, particles having a particle size $d_{50} < 20$ μm and having a density difference between particle and gas $> 1000$ $kg/m^3$ fall into Geldart class C (cohesive) [D. Geldart, Types of gas fluidization, Powder Technology 7 (1973) 258]. Particles of Geldart class C are characterized in that they cannot be easily converted to a fluidized state. Owing to their low particle size, the effect of the inter-particulate attraction forces is in the same order of magnitude as or greater than the forces which act on the primary particles as a result of the gas flow. Correspondingly, effects occur such as the raising of the fluidized bed as a whole and/or the formation of channels. If channels are formed, tubes are formed in the particle bed instead of a fluidized bed, and the fluidizing gas flows preferentially through these tubes, while the major part of the bed receives no traversing flow at all. Because of this, the fluidization does not achieve homogeneity. If the gas velocity is increased significantly above the minimal fluidization velocity of the primary particles in the bed, agglomerates are formed over time that consist of individual particles, which may be fluidized completely or partially. A typical behavior is the formation of layers having agglomerates of different sizes. In the bottommost layer directly above the inflow base, these agglomerates are very large, and show very little movement or none. In the layer above, there are smaller agglomerates, which are fluidized. In the topmost layer, the smallest agglomerates are present, and are partially entrained by the gas flow, constituting a technical problem in the process. The fluidization behavior of such particle beds is additionally characterized by formation of large gas bubbles and by low expansion of the fluidized bed. In the literature, this behavior is also termed "agglomerate bubbling fluidization" (ABF) [Shabanian, J.; Jafari, R.; Chaouki, J., Fluidization of Ultrafine Powders, IRECHE., vol. 4, N.1, 16-50].

To the skilled person it is clear that beds fluidized by ABF, because of the inhomogeneities within the fluidized bed and the associated inhomogeneous mass and heat transfer conditions, are unsuited to the production of substances having homogeneous properties.

It is for this reason that GB 2580110 B2 carries out fluidization, for example, of particles having a size ($D_{50}$) of more than 50 μm in a fluidized bed with 1.25% by volume of monosilane. After the end of the reaction, however, the resulting particles have to be ground to the required target size of <20 μm. In this fluidized bed, the fluidization of particles <20 μm would lead to instances of severe agglomeration and to inhomogeneous infiltration of the porous carbon particles.

There are known means of assisting fluidization in order to convert particles <20 μm in the form of agglomerates into a predominantly homogeneous fluidized bed. For example, U.S. Pat. No. 7,658,340 B2 describes how, through the input of additional force components such as vibrational forces, magnetic forces, acoustic forces, rotational/centrifugal forces or combinations thereof, in addition to the force exerted by the fluidizing gas, the size of the agglomerates consisting of $SiO_2$ nanoparticles (Geldart class C) in the fluidized bed is influenced such that a predominantly homogeneous fluidized bed is formed.

Cadoret et al. [Cadoret, L.; Reuge, N.; Pannala, S.; Syamlal, M.; Rossignol, C.; Dexpert-Ghys, J.; Coufort, C.; Caussat, B.; Silicon Chemical Vapor Deposition on macro and submicron powders in a fluidized bed, Powder Technol., 190, 185-191, 2009] describe the deposition of silicon from monosilane $SiH_4$ onto nonporous, sub-micrometer-size titanium oxide particles in a fluidized bed reactor which is vibrated. The input of vibration allowed the agglomerates in the fluidized bed to be limited to the size range from 300 to 600 μm.

Fluidized bed processes without means of assisting fluidization are unsuitable for the process of incorporating/depositing silicon in porous matrix particles, because particles with a size <20 μm cannot be homogeneously fluidized. Because of the inhomogeneous fluidized bed, it is impossible to generate homogeneous products.

Fluidized bed processes with means of assisting fluidization are disadvantageous for the process of incorporating/depositing silicon in porous matrix particles, since the fluidization of the particles <20 μm entails great technical complexity. The additional complexity is associated with large expenditures/costs for capital investment and maintenance.

A further disadvantage of the incorporation of silicon by means of fluidized bed processes with means of assisting fluidization is that in the course of the process, there are changes in the properties of the primary particles, such as the particle density or the surface consistency. These changes have unknown effects on the formation of agglomerates; for the process regime, such formation ought to be known. It is impossible to ensure homogeneous process conditions over the entire process operating time.

A further disadvantage of the fluidized bed technology is that because of the fluidization of the agglomerates consisting of the primary porous particles, gas flows are required, leading to discharge of primary particles and/or relatively small agglomerates.

A fundamental disadvantage of the fluidized bed technology is that the stream of fluidizing gas for forming a homogeneous fluidized bed is dependent on the size of the particles/agglomerates in the fluidized bed. As a result, the amount of reactive gas metered in and the contact time of the reactive gas with the porous particles are dependent on the state of fluidization and mixing of the particle bed. In the fluidized bed process, for example, the contact time of the gaseous reactive component with the particle bed can only be increased by reducing the gas velocity. The gas velocity, however, is the critical variable for ensuring the state of fluidization and mixing.

One possibility for resolving the disadvantages of the fluidized bed technology is for the mixing of the particle bed with the gas phase to be independent of flow.

US 2020/0240013 A1 describes the deposition of silicon from a silicon-containing gas to particles having a mean particle size in the lower millimeter range in a stirred bed reactor. Owing to the particle size, the assumption is that the bed material used has very high fluidity. By means of the apparatus described, the exchange between gas and solid takes place through the use of a central stirring screw through which the reaction gas is supplied at the same time, through openings in the stirred bed. The patent application is directed in particular to the advantages of the treatment of particles in the millimeter range, since for particles of this size, large fluidizing gas streams are necessary for bringing the particles into the fluidized state.

The stirrer used in US 2020/0240013 A1 is unsuitable, however, for circulating cohesive particles <20 μm.

From the technical literature it is known that particles in a stirred bed can be circulated using a wide variety of different stirring elements [M. Müller, Feststoffmischen [Solids Mixing], Chemie Ingenieur Technik 2007, 79, 7]. The use of a close-clearance helical stirrer, for example, transports the particles laterally upward in the reactor, producing a circulation stream with relative movement of the particles because of inslipping material. Adhesion of the particles on the reactor wall is prevented.

A parameter describing the movement state of the particle bed is the Froude number (Fr), which indicates the ratio of centrifugal force to weight force in the rotating system.

$$Fr = \frac{r_c \omega^2}{g}$$

In this equation, $r_c$ is the characteristic radius relevant to the system. For systems with a rotating mixing tool, $r_c$ corresponds to the outside radius of the stirring element. In the case of systems with a rotating drum, $r_c$ is the inside radius of the container. The circular frequency $\omega=2\pi n$ is dependent on the rotary speed n of the rotating system. The effect of the weight force is taken into account via the acceleration due to gravity, g. In the case of low Froude numbers, the weight force component is predominant, and so the radial transport of material is low. Circulation of the particle bed is inadequate. In the case of high Froude numbers, on the other hand, the centrifugal force component dominates, causing the material to be moved excessively against the container wall. Here again, circulation of the particle bed is inadequate.

A parameter for describing the contact time between the gas phase and the stirred particle bed is the residence time of the gaseous reactive component in the reactor. The mean residence time $t_V$ may be calculated as the quotient of reactor volume and volume flow of the metered gas phase $\dot{V}_F$:

$$t_V = \frac{V_R}{\dot{V}_F}$$

A further important measure for evaluating the homogeneous reaction conditions in the stirred bed reactor is the ratio $t_u/t_v$ of the particle bed circulating time $t_u$ to the residence time of the silicon precursor $t_v$. The particle bed circulating time $t_u$ is calculated as the quotient of the reactor volume $V_R$ and the volume flow of circulated particles $\dot{V}_P$.

$$t_U = \frac{V_R}{\dot{V}_P}$$

The volume flow of the particles circulated by the stirring element, $\dot{V}_P$, is defined as the particle volume displaced in tangential direction by the stirring element per unit time and is described generally by the following formula:

$$\dot{V}_P = n\, 2\pi \sum_i \int_{r_{R,inner,i}}^{r_{R,outer,i}} r_{R,i}[h_{o,i}(r) - h_{u,i}(r)]dr_{R,i}$$

The volume flow of circulated particles is the product of rotary speed n and the sum total of all tangentially displaced volumes by the individual stirring units i of the stirring element. The geometrical dimensions of each individual stirring unit are accounted for by the distance of the inner edge of the stirring element to the rotational axis $r_{R,inner,i}$, by the distance of the outer edge of the stirring element to the rotational axis $r_{R,outer,i}$ and by the upper contour $h_{o,i}(r)$ and lower contour $h_{u,i}(r)$ of the respective stirring unit.

Where the ratio $t_u/t_v$ adopts values <1, the process of particle circulation is faster than the flow traversal of the bed by a gas, producing a uniform distribution between gas and particles. At values >1 for the ratio $t_u/t_v$, the gas flows through the stirred bed faster than the bed itself is circulated. As a result, in the stirred bed, zones with different deposition conditions are formed, leading to inhomogeneous product distribution in the bed.

Against this background, the object was to provide a process for producing silicon-containing materials, preferably with high storage capacity for lithium ions, which when used as active material in anodes of lithium-ion batteries enable high cycling stability, starting from porous particles and silicon precursors, the process being technically simple to implement and being devoid of the disadvantages affecting the above-described processes of the prior art, particularly in relation to the discharge of particles, the reaction times, and the required infrastructure.

A particular desire is to minimize the dead space of the bed not agitated by the stirrer. Hence the material at the heated parts of the shell is kept in motion with maximum efficiency and the energy is conveyed from the wall into the bed. In this way, moreover, the adhesion of particles at the wall is prevented.

The invention provides a process for producing silicon-containing materials by thermal decomposition of silicon precursors in the presence of porous particles, where silicon is deposited in pores and on the surface of the porous particles, > where the thermal decomposition of the silicon precursors takes place in the reaction zone of a gas-traversed reactor and the particles are circulated in the reaction zone during the thermal decomposition by means of a stirrer which is close-clearance in the heated regions,
> where the stirring mechanism is close-clearance if in equation 1

$$W(h) = \frac{u_R(h)}{u_B(h)} \tag{1}$$

> for half of all values of h the close clearance W(h) in the reaction zone is W(h)>0.9, where $u_R(h)$=the outer circumference of the stirring mechanism in the sectional face at the height coordinate h and $u_B(h)$=the inner circumference of the reactor.

It has been found that, surprisingly, through the use of a close-clearance stirring tool in the invention, very small particles, more particularly particles <20 μm, are circulated in a reactor, and the gas stream of reactive component is metered, such that the contact time between gas phase and solid has a duration such that the process of introducing silicon into the porous particles takes place homogeneously and with high conversion of the silicon precursor and at the same time the discharge of particles from the reactor with the gas stream is minimal.

In comparison to the fluidized bed reactor with means of assisting fluidization, the gas-traversed stirred reactor or stirred bed reactor (SBR) has a simpler construction, as the quantity of gas requiring compression and preheating in the SBR is lower, the gas not being utilized for fluidizing. This means that costs for the associated assemblies are lower. There is no need in the case of the SBR for elaborate control and regulation technology for the operation of the means of assisting fluidization. In comparison to the FBR, the SBR has a smaller build, as the stirred bed occupies a lower volume for a given mass. The specific capital investment costs are lower.

In comparison to GB 2580110 B2, no further operating steps are necessary with the process of the invention.

In comparison to the fluidized bed reactor, particle circulation is independent of the supply of a gas phase. Higher residence times are possible, leading to higher conversions of the reactive components.

The stirring in the process of the invention only circulates the particles. The particles are not swirled up by the stirrer.

The gas stream is preferably dimensioned such that the swirling of the particles in the process of the invention by the gas flow is minimal and hence the discharge of particles from the reactor is likewise minimal. At the same time, the gas stream is dimensioned preferably such that the conversion of the reactive components employed is at its maximum.

Homogeneous deposition conditions are possible because of suitable choice of rotary stirrer speed parameter, expressed by the dimensionless Froude number, and because of a suitable metering rate.

Relative to US 2020/0240013 A1, the process of the invention is improved through the use of a close-clearance stirrer.

The rotary stirrer speed is preferably set such that the particle bed circulating times are smaller than the residence times of the fluid reactive component, more particularly of the porous particles. The result is sufficiently effective macromixing of the fluid phase with the solids phase, leading to homogeneous treatment of all the particles in the solids phase.

A further, economic advantage of the process, in contrast to the non-inventive processes, lies in the higher silicon yield. Moreover, the deposition of silicon on and especially in the porous particles is particularly uniform, resulting in high stability of the resultant silicon-containing material when employed as active material in anodes for lithium-ion batteries, with a low volume change on cycling at the same time.

The close clearance $W(h)$ of a stirring mechanism in a rotationally symmetrical reactor is defined as the quotient of the circumferences of two planar sectional faces perpendicular to the rotational axis of two rotational faces, where h is the height coordinate. The inner rotational face is formed by one complete revolution of the stirring mechanism and is characterized by the distance $r_R(h)$ from the rotational axis to the outer contour of the stirring mechanism. The stirring mechanism includes all components attached thereto. A planar section at each arbitrary point h of the rotational face perpendicular to the rotational axis forms a circular sectional face. The circumference of the inner sectional face is calculated as $$u_R(h) = 2\pi r_R(h)$$

The outer rotational face is formed by rotation of the inner contour of the reactor about the rotational axis. It is described by the distance $r_B(h)$. The inner contour of the reactor includes all components attached thereto. The circumference of an arbitrary sectional face of the outer rotational face perpendicular to the rotational axis is calculated as $$u_B(h) = 2\pi r_B(h)$$

Using the circumferences, the close clearance is defined as follows:

$$W(h) = \frac{u_R(h)}{u_B(h)}$$

Generally speaking, a reactor may contain one or more stirring mechanisms. The contour of each individual stirring mechanism forms a rotational face by complete revolution. These rotational faces may be present separately. With preference they may be superimposed on one another. Sectioning the individual rotational faces or the superimposed rotational face at an arbitrary point perpendicular to the rotational axis or to the rotational axes, respectively, produces figures or a figure whose circumference may be ascertained. Where multiple figures are produced, the overall circumference is determined by summing the individual circumferences.

Generally speaking, the reactor may consist of one or more reactor parts, which preferably are each rotationally symmetrical and connected to one another. The entirety of all the reactor walls envelop a figure. Sectioning this figure at an arbitrary point perpendicular to the rotational axis of the stirrer mechanisms allows the circumference of the resultant figure to be determined. The close clearance $W(h)$ is calculated in a manner analogous to that for the rotationally symmetrical reactor.

The close clearance may vary with h. The configuration of the stirrer is in accordance with the invention if for at least half of all values of h, the close clearance $W(h)$ in the reaction zone is $W(h)>0.9$; the parameter defined for this is $W(h_{50\%})$. In one preferred embodiment $W(h_{50\%})>0.95$. In one particularly preferred embodiment $W(h_{50\%})>0.97$. In one especially preferred embodiment $W(h_{50\%})>0.99$. The reaction zone is the region in the reactor where the stirred particle bed is contacted with the reactive component and the reactive component is decomposed. For specific cases of the process, $W(h_{50\%})$ values of $>1$ are also possible.

The process is preferably carried out in a cascade reactor system comprising multiple reactors. Implementation in a cascade reactor has the advantage over implementation in only one reactor that the long cooling and heating phases of a reactor are reduced. This harbors an advantage in time and in energy over just one reactor and leads to reduced stressing of the reactor materials. The cascade reactor system offers the advantage, moreover, that the individual reactors can be designed precisely for their purpose. The cascade reactor system is also more readily scalable, allowing different numbers of reactors to be combined with one another to form the individual phases.

In one preferred embodiment, the process comprises at least phases 1 to 3:

Phase 1: Filling of a reactor A with porous particles and pretreatment of the particles with subsequent transfer of the pretreated particles to a reactor B or to a reservoir vessel, or the material remains in the reactor A.

Phase 2: Passing of a flow of a gas consisting of an inert gas and/or at least one reactive component containing a silicon precursor and/or at least one silicon-free precursor through reactor B, conditioning of the reactor to a temperature at which the thermal decomposition of the reactive component takes place on the surface and in the pores of the porous particles. The particle bed in reactor B is circulated with a close-clearance stirrer such that the movement state of the particle bed can be described with Froude numbers in the range between 1 and 10. The gas phase is supplied to reactor B, while the particle bed in reactor B is circulated by a close-clearance stirring element such that the ratio of circulating time to mean residence time of the reactive component is less than 1. The reaction may proceed both under subatmospheric and under super-atmospheric pressure. After the silicon has been introduced into and onto the pores of the porous particles, the silicon-containing materials are transferred to reactor C or to a reservoir vessel for interim storage, or the material remains in the reactor B.

Phase 3: Aftertreatment of the silicon-containing particles for functionalization and/or coating of the surface of the silicon-containing particles. Cooling of the particles to a defined temperature and withdrawal of silicon-containing materials from reactor C, and preferably direct transfer to a reservoir vessel or direct dispensing into a suitable container.

In Phase 1 a heatable and/or vacuum-resistant and/or pressure-resistant reactor A is filled with porous particles. This filling may take place manually or automatically.

The filling of reactor A with porous particles may be carried out, for example, under inert gas atmosphere or, preferably, ambient air. Inert gases used may comprise, for example, hydrogen, helium, neon, argon, krypton, xenon, nitrogen, or carbon dioxide, or mixtures thereof, such as forming gas, for example. Argon or more particularly nitrogen are preferred.

Automatic filling may be accomplished, for example, using a metering screw, star wheel, vibrating trough, plate-type metering system, belt-type metering system, vacuum metering system, negative weighing-out or another metering system, from, for example, a silo, a bag chute or another container system.

The aim of pretreating the particles in reactor A in phase 1 is to remove air/oxygen, water or dispersants, such as surfactants or alcohols, for example, and impurities from the particles. This may be achieved by inertization with inert gas, temperature increase to up to 1000° C., reduction in pressure to down to 0.01 mbar, or by a combination of the individual operating steps. Inert gas used may comprise, for example, hydrogen, helium, neon, argon, krypton, xenon, nitrogen, or carbon dioxide, or mixtures thereof, such as forming gas, for example. Argon or, more particularly, nitrogen are preferred.

The aim of the pretreatment in phase 1 may also be to alter the chemical surface nature of the porous particles with further substances. The addition may be made before or after drying, and a further heating step may take place before the material is transferred to reactor B. The substances may be introduced in gas form, solid, liquid or as a solution into the reactor, the possibilities including mixtures, emulsions, suspensions, aerosols or foams. The substances involved may comprise, for example, carbon dioxide, water, sodium hydroxide, potassium oxide, hydrofluoric acid, phosphoric acid, nitric acid, hydrochloric acid, ammonia, ammonium dihydrogenphosphate, lithium nitrate, sodium nitrate, potassium nitrate, lithium chloride, sodium chloride, potassium chloride, lithium bromide, sodium bromide, potassium bromide, and alkoxides.

Transfer of the porous particles into a further reactor or vessel may be accomplished, for example, by a drop tube, continuous conveyor, flow conveyor/suction or pressure conveying unit (e.g. vacuum conveyor, transport blower); mechanical conveyors (e.g. roller conveyors with drive, screw conveyors, circular conveyors, circulation conveyors, bucket unit, star wheel locks, chain conveyors, scraper conveyors, belt conveyors, oscillation conveyors); gravity conveyors (e.g. chutes, roller bed, ball bed, rail bed), and also by means of non-continuous conveyors, floor-based and rail-free (e.g. automated vehicle, manual forklift truck, electric forklift truck), driverless transport systems (DTS), air-cushion vehicle, hand cart, electric cart, motor vehicle (tractor, wagon, forklift stacker), transfer carriage, transfer/lift carriage, shelf access device (with/without converter, able to follow curved paths); floor-based, rail-bound (e.g. plant railway, track vehicle); floor-free (e.g. trolley track), crane (e.g. bridge crane, portal crane, jib crane, tower crane), electric overhead track, small-vessel transport system; fixed (e.g. elevator, service lift and cherry picker, stepwise conveyor).

In phase 2, the pretreated material in reactor B is brought preferably to a temperature of 100 to 1000° C., more preferably 250 to 600° C. and especially preferably 300 to 500° C. Reactor B, during the changing of the temperature or when the temperature is attained or during traversal of a temperature profile, is traversed in alternation or simultaneously with a gas consisting of at least one inert gas and/or at least one reactive component consisting of at least one silicon precursor and/or at least one silicon-free precursor. Different gas compositions in succession are possible or are varied during phase 2 within the composition specified. The metering rate of the reactive component-containing gas phase with at least one silicon precursor, relative to pore volume, is defined as the mass of silicon [g] contained in the silicon precursor that is supplied per hour, relative to the absolute pore volume $[cm^3]$ of all the porous particles introduced into reactor B. Over the course of the deposition of the silicon precursor, metered addition takes place preferably at a rate of 0.1-2 g, more preferably 0.5 to 1.5 g, of Si per $cm^3$ of pore volume of the porous particles used per hour.

An alternative is the area-based metering rate of the reactive component-containing gas phase with at least one silicon precursor, as the mass of silicon [kg] contained in the silicon precursor that is supplied per hour, relative to the largest flow cross-sectional area $[m^2]$ in the reaction zone. The cross section is measured for the empty reactor. The reaction zone is the region in the reactor in which the stirred particle bed is contacted with the reactive component and the precursor is decomposed.

The metering rate of precursor supplied is calculated such that the ratio of particle bed circulating time to mean residence time of the reactive component in the reactor is always less than 1.

The gas phase may be metered in continuously or in pulses. The metering rate may vary during the operating time of the reaction.

In the rotationally symmetrical reactor, the silicon precursor is metered in over the course of the deposition preferably at a rate of 1-700 kg, more preferably 10 to 300 kg, of Si per $m^2$ of the outer rotational area per hour.

Over the entire time of the thermal decomposition, the reactor B is traversed preferably by an amount of silicon-containing reactive component such that, in relation to the weighed amount of porous particles, the amount of silicon deposited is sufficient for the target capacity of the silicon-containing material being produced.

The heating of reactor B in phase 2 may take place, for example, at a constant heating rate or at multiple different heating rates. Heating rates may be adapted by the skilled person in each individual case according to the design of the process, in line for example with the size of the reactor, the amount of the porous particles in the reactor, the stirring technology or the planned reaction time.

The heating of reactor B in phase 2 takes place preferably at heating rates of 1 to 100° C. per minute, more preferably at heating rates of 2 to 50° C. per minute.

The temperature at which the silicon precursor begins to decompose may be dependent, for example, on the porous particles used, on the silicon precursor or precursors used and on the other boundary conditions of the decomposition, such as, for example, the partial pressure of the silicon precursor at the time of decomposition and the presence of other reactive components, such as catalysts, for example, that influence the decomposition reaction.

During the decomposition of the silicon precursors in phase 2, the temperature may be held constant or else varied.

The objective is the largely complete conversion of the silicon precursors during the contact time of the gas with the stirred bed, while generating a silicon-containing material that is suitable for use.

The bed temperature during phase 2 and 3 and particularly the reaction zone of the reactor equipped with the close-clearance stirrer is situated preferably in the range from 100 to 1000° C., more preferably from 250 to 600° C. and most preferably from 300 to 500° C. For example, the target temperatures for $SiH_4$ are preferably between 30° and 500° C., more preferably in the range from 320 to 450° C. and very preferably in the range from 320 to 430° C. The target temperatures for $HSiCl_3$ are preferably between 38° and 1000° C., more preferably in the range from 420 to 600° C. The target temperatures for $H_2SiCl_2$ are preferably between 35° and 800° C., more preferably in the range from 380 to 500° C.

Where hydrocarbons are used in phase 3 and/or additionally to the deposition of silicon during phase 2, as further reactive components containing no silicon precursor, target temperatures are employed at which the hydrocarbons begin to decompose and carbon is deposited in pores and on the surface of the porous particles. The target temperatures in this embodiment are chosen preferably in the range from 250 to 1000° C., more preferably from 350 to 850° C. and most preferably from 400 to 650° C.

In phase 2, the bed consisting of porous particles is circulated, preferably continuously. Circulation is accomplished via one or more stirring elements or via a rotating movement of the reactor itself (for example, intensive mixers from Maschinenfabrik Gustav Eirich) or combinations thereof. The movement state of the moved bed is characterized by Froude numbers of between 1 and 10. The Froude number is preferably between 1 and 6, more preferably between 1 and 4.

The thermal decomposition of the silicon precursors in the presence of porous particles takes place preferably at 0.05 MPa to 5 MPa, more preferably at 0.08 to 0.7 MPa.

The gas phase from phase 2 consists of an inert gas and/or at least one reactive component containing a silicon precursor and/or at least one silicon-free precursor in possibly varying composition. The one or the multiple silicon precursor(s) may be introduced into reactor B generally in mixed form or separately or in a mixture with inert gas constituents or as pure substances. The reactive component preferably contains an inert gas constituent of 0% to 99%, more preferably at most 50%, especially preferably at most 30% and, with very particular preference, at most 5%, based on the partial pressure of the inert gas constituent as a proportion of the total pressure of the reactive component under standard conditions (according to DIN 1343).

The silicon-containing reactive component contains at least one precursor which under the chosen conditions, such as thermal treatment, for example, is able to react to give silicon. The precursor is preferably selected from the group containing silicon-hydrogen compounds such as monosilane $SiH_4$, disilane $Si_2H_6$ and also higher linear, branched or else cyclic homologs, neo-pentasilane $Si_5H_{12}$, cyclo-hexasilane $Si_6H_{12}$, chlorine-containing silanes, such as, for example, trichlorosilane $HSiCl_3$, dichlorosilane $H_2SiCl_2$, chlorosilane $H_3SiCl$, tetrachlorosilane $SiCl_4$, hexachlorodisilane $Si_2Cl_6$, and also higher linear, branched or else cyclic homologs such as, for example, 1,1,2,2-tetrachlorodisilane $Cl_2HSi$—$SiHCl_2$, chlorinated and part-chlorinated oligo- and polysilanes, methylchlorosilanes, such as, for example, trichloromethylsilane $MeSiCl_3$, dichlorodimethylsilane $Me_2SiCl_2$, chlorotrimethylsilane $Me_3SiCl$, tetramethylsilane $Me_4Si$, dichloromethylsilane $MeHSiCl_2$, chloromethylsilane $MeH_2SiCl$, methylsilane $MeH_3Si$, chlorodimethylsilane $Me_2HSiCl$, dimethylsilane $Me_2H_2Si$, trimethylsilane $Me_3SiH$, or else mixtures of the silicon compounds described.

In one specific embodiment of the process the monosilane or mixtures of silanes such as, for example, mixtures of monosilane $SiH_4$, trichlorosilane $HSiCl_3$, dichlorosilane $H_2SiCl_2$, monochlorosilane $H_3SiCl$ and tetrachlorosilane $SiCl_4$, where each constituent may be present from 0 to 99.9 wt %, is produced by a suitable process only directly before deployment in the reactor. Generally speaking, these processes start from trichlorosilane $HSiCl_3$, which is rearranged over a suitable catalyst (e.g. AmberLyst™ A21DRY) to form the other components of the mixture described. The composition of the resulting mixture is determined primarily by the work-up of the mixture resulting after one or more rearrangement stages, at one or more different temperatures.

Particularly preferred reactive components are selected from the group encompassing monosilane $SiH_4$, oligomeric or polymeric silanes, especially linear silanes of the general formula $Si_nH_{n+2}$, where n may comprise an integer in the 2 to 10 range, and also cyclic silanes of the general formula —$[SiH_2]_n$—, where n may comprise an integer in the 3 to 10 range, trichlorosilane $HSiCl_3$, dichlorosilane $H_2SiCl_2$, and chlorosilane $H_3SiCl$, which may be employed alone or else as mixtures; employed very preferably are $SiH_4$, $HSiCl_3$, and $H_2SiCl_2$, alone or in a mixture.

During the metering of the reactive components into the reactors, the constituents of the reactive component may be present for example in gaseous, liquid or sublimable solid form. The reactive component is preferably gaseous, liquid, solid, sublimable for example, or a composition optionally consisting of substances in different aggregate states. In one variant of the process, the reactive component is introduced directly into the bed of porous particles in the reactor, as for example from below or from the side or using a special stirrer.

Furthermore, additionally, the reactive components in phase 2 and/or 3 may also comprise further reactive constituents, such as dopants based, for example, on compounds containing boron, nitrogen, phosphorus, arsenic, germanium, iron or else nickel. The dopants are preferably selected from the group encompassing ammonia $NH_3$, diborane $B_2H_6$, phosphane $PH_3$, germane $GeH_4$, arsane $AsH_3$, iron pentacarbonyl $Fe(CO)_4$ and nickel tetracarbonyl $Ni(CO)_4$.

Further reactive constituents which may be present in the gas phase comprise hydrogen or else hydrocarbons, selected from the group containing aliphatic hydrocarbons having 1 to 10 carbon atoms, preferably 1 to 6 carbon atoms, such as, for example, methane, ethane, propane, butane, pentane, isobutane, hexane, cyclopropane, cyclobutane, cyclopentane, cyclohexane, cycloheptane; unsaturated hydrocarbons having 1 to 10 carbon atoms such as, for example, ethene, acetylene, propene, methylacetylene, butylenes, butynes (1-butyne, 2-butyne), isoprene, butadiene, divinylbenzene, vinylacetylene, cyclohexadiene, cyclooctadiene, cyclic unsaturated hydrocarbons, such as, for example, cyclopropene, cyclobutene, cyclopentene, cyclohexene, cyclohexadiene, cyclopentadiene, dicyclopentadiene or norbornadiene, aromatic hydrocarbons, such as, for example, benzene, toluene, p-, m-, o-xylene, styrene (vinylbenzene), ethylbenzene, diphenylmethane or naphthalene, other aromatic hydrocarbons, such as, for example, phenol, o-, m-, p-cresol, cymene, nitrobenzene, chlorobenzene, pyridine, anthracene or phenanthrene, myrcene, geraniol, thioterpineol, norbornane, borneol, isoborneol, bornane, camphor, limonene, terpinene, pinene, pinane, carene, phenol, aniline, anisole, furan, furfural, furfuryl alcohol, hydroxymethylfurfural, bishydroxymethylfuran, and mixed fractions comprising a multiplicity of such compounds, such as, for example, those from natural gas condensates, crude oil distillates or coking oven condensates, mixed fractions from the product streams from a fluid catalytic cracker (FCC), steam cracker or a Fischer-Tropsch synthesis plant, or, very generally, hydrocarbon-containing substance streams from the processing of wood, natural gas, crude oil and coal.

In one particularly preferred embodiment, in a first reaction cycle in phase 2, a reactive component containing at least one silicon precursor is treated, and in the second reaction cycle in phase 2, a reactive component containing at least one hydrocarbon and being preferably silicon-free is treated. Through repetition of these two steps it is possible, for example, to obtain a silicon-containing material which has no outwardly facing free silicon surface. Optionally, in an upstream reaction cycle in phase 2, a further hydrocarbon-containing, silicon-free reactive component is used. By this means, for example, a silicon-containing material is obtainable which has a carbon layer between the porous particles and the deposited silicon and which optionally additionally carries an outer carbon layer, meaning that no outwardly facing free silicon surface is present.

In one preferred embodiment, the temperature, the pressure, pressure changes or differential pressure measurements and gas flow measurements in reactor B are determined using commonplace instruments and methods of measurement. After customary calibration, measurements with different instruments produce the same results.

The course of the reaction in phase 2 is preferably monitored analytically, in order to recognize the end of the reaction and so to minimize the reactor occupancy time. Methods for observing the course of the reaction include, for example, temperature measurement for determining exothermic or endothermic events for determining the course of the reaction through changing ratios of solid to gaseous reactor content constituents, and also further techniques which enable observation of the changing composition of the gas space during the reaction. In one preferred variant of the process, the composition of the gas phase is determined by a gas chromatograph and/or thermal conductivity detector and/or an infrared spectroscope and/or a Raman spectroscope and/or a mass spectrometer. In one preferred embodiment, a thermal conductivity detector is used to determine the hydrogen content, and/or a gas chromatograph or gas infrared spectroscope is used to determine any chlorosilanes present. In another preferred variant of the process, a technical component is used which enables the separation of hydrogen and silane. This separation may be performed, for example, via filtration and/or membrane techniques (solution-diffusion model and hydrodynamic model), adsorption, chemisorption, absorption or chemisorption or molecular sieves (e.g. zeolite).

This component, in the case of hydrogen as gaseous reaction product, enables a gas circulation process. In that case, the gas discharged in phase 2 is cleaned and/or the fraction of silicon-containing reactive component is increased, followed by return to the reactor until the desired amount of silicon has been deposited. In another embodiment, the gas is separated into its constituents and disposed of in that way.

In a further preferred variant of the process, the reactor B or the gas discharge site is equipped with a technical means for removing condensable or resublimable by-products that occur. In one particularly preferred variant here, silicon tetrachloride is condensed and removed separately from the silicon-containing material.

In one preferred embodiment of the process, the metering procedures in phase 2 are repeated multiply, in which case the respective silicon precursor treated in phase 2 may be the same or different in each case, with mixtures of multiple silicon precursors also being possible. Similarly, the silicon-free reactive component treated in phase 2 may be the same or different in each case or may consist of mixtures of different reactive components. After the multiple repetition of the individual metering procedures in phase 2, the implementation in reactor B is ended with the transfer of the silicon-containing particles to reactor C.

In phase 3 of the process, the silicon-containing particles in reactor C may be aftertreated and/or deactivated and/or coated. This is preferably done by purging reactor C with oxygen, more particularly with a mixture of inert gas and oxygen. In this way it is possible, for example, to modify and/or functionalize and/or deactivate the surface of the silicon-containing material. It is possible for example to achieve a reaction of any reactive groups present on the surface of the silicon-containing material. For this purpose, a mixture of nitrogen, oxygen and optionally alcohols and/or water is preferably used which contains preferably at most 20 vol %, more preferably at most 10 vol % and especially preferably at most 5 vol % of oxygen, and also preferably at most 100 vol %, more preferably at most 10 vol % and especially preferably at most 1 vol % of water. This step takes place preferably at temperatures of at most 250° C., more preferably at most 100° C. and especially preferably at most 50° C. The particle surfaces may also be deactivated with a gas mixture comprising inert gas and alcohols. Used with preference here are nitrogen and isopropanol. It is, though, also possible to use methanol, ethanol, butanols, pentanols or longer-chain and branched alcohols and diols.

The particles may also be deactivated by dispersion in a liquid solvent or a solvent mixture.

This mixture may comprise, for example, isopropanol or an aqueous solution.

The deactivation of the particles in phase 3 may optionally also be accomplished by a coating using C-, Al- and/or B-containing precursors at temperatures of 200-800° C. with optionally subsequent treatment with oxygen-containing atmosphere.

Aluminum-containing precursors used may be, for example, trimethylaluminum ($(CH_3)_3Al$), aluminum 2,2,6,6-tetramethyl-3,5-heptanedione ($Al(OCC(CH_3)_3CHCOC(CH_3)_3)_3$), tris(dimethylamido)aluminum ($Al(N(CH_3)_2)_3$) and aluminum triisopropoxide ($C_9H_{21}AlO_3$).

Boron-containing precursors used may be, for example, borane ($BH_3$), triisopropyl borate ($[(CH_3)_2CHO]_3B$), triphenylborane ($(C_6H_5)_3B$) and tris(pentafluorophenyl) borane ($(C_6F_5)_3B$. In phase 3 it is, however, also possible to introduce, for example, aftercoatings of the particles with solid-state electrolytes via thermal decompositions of, for example, tert-butyllithium and trimethyl phosphate.

In phase 3 of the process, in principle, the silicon-containing materials are withdrawn from reactor C, optionally with retention of an inert gas atmosphere present in reactor C. This may be accomplished, for example, via the following discharge methods: pneumatically (by means of superatmospheric or subatmospheric pressure); mechanically (star wheel lock, plate discharge, discharge screw or stirring element in the reactor, belt discharge) or gravimetrically (double flap or double ball valve, optionally with vibration assistance).

Preferred silicon-free reactive components are one or more hydrocarbons. Through thermal decomposition of the hydrocarbons it is possible in general to deposit carbon in pores and on the surface of the porous particles. Examples of hydrocarbons are aliphatic hydrocarbons having 1 to 10 carbon atoms, especially 1 to 6 carbon atoms, preferably methane, ethane, propane, butane, pentane, isobutane, hexane, cyclopropane, cyclobutane, cyclopentane, cyclohexane and cycloheptane; unsaturated hydrocarbons having 1 to 10 carbon atoms, such as, for example, ethene, acetylene, propene or butene, isoprene, butadiene, divinylbenzene, vinylacetylene, cyclohexadiene, cyclooctadiene, cyclic unsaturated hydrocarbons, such as, for example, cyclopropene, cyclobutene, cyclopentene, cyclohexene, cyclohexadiene, cyclopentadiene, dicyclopentadiene or norbornadiene, aromatic hydrocarbons, such as, for example, benzene, toluene, p-, m-, o-xylene, styrene (vinylbenzene), ethylbenzene, diphenylmethane or naphthalene, other aromatic hydrocarbons, such as, for example, phenol, o-, m-, p-cresol, cymene, nitrobenzene, chlorobenzene, pyridine, anthracene or phenanthrene, myrcene, geraniol, thioterpincol, norbornane, borneol, isoborneol, bornane, camphor, limonene, terpinene, pinene, pinane, carene, phenol, aniline, anisole, furan, furfural, furfuryl alcohol, hydroxymethylfurfural, bishydroxymethylfuran, and mixed fractions comprising a multiplicity of such compounds, such as, for example, those from natural gas condensates, crude oil distillates or coking oven condensates, mixed fractions from the product streams from a fluid catalytic cracker (FCC), steam cracker or a Fischer-Tropsch synthesis plant, or, very generally, hydrocarbon-containing substance streams from the processing of wood, natural gas, crude oil and coal.

The silicon-free reactive components, namely the reactive components which comprise one or more hydrocarbons but no silicon precursor, preferably contain no further component or one or more inert gases and/or one or more reactive constituents, such as hydrogen, for example, and/or one or more dopants. Dopants are, for example, compounds containing boron, nitrogen, phosphorus, arsenic, germanium, iron or nickel. The dopants are preferably selected from the group encompassing ammonia $NH_3$, diborane $B_2H_6$, phosphane $PH_3$, germane $GeH_4$, arsane $AsH_3$ and nickel tetracarbonyl $Ni(CO)_4$.

Als reactors for the purposes of this specification, preference is given to reactor types selected from the group encompassing retort ovens, tubular reactors, stirred bed reactors, stirred tank reactors and autoclaves. Particular preference is given to using stirred reactors and autoclaves, more preferably stirred reactors and very preferably stirred tank reactors.

In one specific variant of the process, reactor A, B and C are the same vessel. It is not ruled out for reactor A, B and C to be the same vessel. In two particular embodiments of the process, the cascade reactor consists of only two mutually dependent reactors. In the first embodiment, phases 1 and 2 are carried out in the same reactor. In the second embodiment, phases 2 and 3 are carried out in one reactor. In both cases, the reactors may have different temperature zones; they may be operated under atmospheric pressure or else under subatmospheric or superatmospheric pressure.

A reactor may be conditionable, pressure-resistant and vacuum-resistant: all combinations are possible. A reactor, however, may also fulfill only one of the above-stated features.

Technical requirements for the reactors and optional special features for specific variants of the invention:

Reactor A:
The reactor is at least conditionable.
The reactor may be vacuum-resistant.
System for preheating, drying and inertizing the porous particles.
A system may be connected for specific addition/metering of the porous particles (for technical description see phase 1).
For drying and/or removal of impurities in the porous particles, a system may be connected which enables the removal of condensable or resublimable substances.
A system may be connected which allows the porous particles to be transferred to the reactor B (for technical description see phase 1).
Reactor B:
The reactor is at least conditionable.
Contains a stirring mechanism in accordance with the invention
System for metering in reaction gas
System for discharging reaction gas
For process simplification, a hydrogen separator (for technical description see phase 2) may be connected.
For removal of condensable or resublimable by-products in the gaseous reaction products, a vessel may be connected which enables the removal of the by-products by condensation or resublimation.
A system may be connected which enables transfer of the material to the reactor C or to a reservoir vessel (for technical description see phase 1).
Reactor C:
The reactor is at least conditionable.
System for removing condensable or resublimable by-products.
A vessel may be connected which enables the removal of the by-products by condensation or resublimation.
System for metering in reaction gas for functionalization
System for discharging reaction gas
A system may be connected which enables transfer of the material to a reservoir vessel (for technical description see phase 3).
A conditionable reactor is, generally, a reactor which may be operated such that the temperature in the interior of the reactor may be adjusted, for example, in the range between 40 and 1000° C. Smaller temperature ranges are possible.

A cascade reactor system for the purposes of the specification is the linking of at least 2 reactors. There is no upper limit on the number of reactors. The number of reactors A, B and C relative to one another, and also their sizes, shape, material and configurations, may differ. The skilled person is able to tailor the quantities of reactors and their sizes to one another in order overall to make the output of the cascade reactor system as efficient as possible. The reactors may be connected directly to one another or may be locally separate from one another, in which case charging takes place by means of movable reservoir vessels. It is also conceivable for two or more reactors B to be connected to one another and for each reaction step to take place in a separate reactor B.

During the operation, the porous particles and also the resultant silicon-containing material may generally take the form of a stationary bed or may be in agitated form with mixing. An agitated mixing of the porous particles or of the resultant silicon-containing material in reactor A, B and C is preferred. During the thermal decomposition of the reactive components in phase 2, however, the particles must be actively mixed. This allows, for example, homogeneous contact of all the porous particles with reactive components, or a homogeneous temperature distribution in the bed. The particles may be circulated, for example, by stirring internals in the reactor or by the movement of the reactor as a whole around a stirrer.

A further preferred form of construction for the reactors A, B and C are fixed reactors with moving stirring elements for the circulation. The object of circulation is to bring the porous solid as uniformly as possible into contact with the gaseous reactive component. Preferred geometries for this are cylindrical reactors, conical reactors, spherical, polyhedral, rotationally symmetrical reactors or combinations thereof. The movement of the stirring element is preferably a rotational movement. Other forms of movement are likewise suitable. The stirring element is driven preferably via a stirring shaft, and there may be one stirring element or a plurality of stirring elements present per stirring shaft. Incorporated in reactors A, B and C there may be a plurality of stirring shafts, on each of which there may be one stirring element or a plurality of stirring elements. The main reactor axis is preferably aligned horizontally or vertically. In a further preferred embodiment, the stirring shafts are installed horizontally or vertically in a reactor of arbitrary orientation. For reactors A, B and C operated vertically, preferred forms of construction are those in which, for example, a stirring element or a plurality of stirring elements mix the bed material through a rotational movement by way of a main stirring shaft. Additional possibilities are forms of construction in which two or more stirring shafts run in parallel. Other possibilities are forms of construction in which two or more stirring shafts are operated not parallel to one another. Another form of construction for a vertically operated reactor A, B or C is characterized by the use of a screw conveyor. The screw conveyor conveys the bed material preferably centrally. A further design in accordance with the invention is the screw conveyor rotating along at the edge of the reactor (Nauta® mixers, Hosokawa). Another preferred form of construction is a planetary stirring system or spiral stirring system. For reactors A, B or C operated horizontally, preferred forms of construction are those in which, for example, a stirring element or a plurality of stirring elements mix the bed material by a rotational movement by way of a main stirring shaft. Also possible are forms of construction wherein two or more stirring shafts run in parallel. Additionally preferred are forms of construction in which two or more stirring shafts are not operated in parallel to one another. For vertically operated reactors A, B or C, preferred stirring elements are elements selected from the group containing helical stirrers, spiral stirrers, anchor stirrers or, generally, stirring elements which convey the bed material axially or radially, or both axially and radially, and exhibit a close clearance W in accordance with the invention. In the case of horizontally operated reactors A, B or C, there are preferably a plurality of stirring elements on one shaft. Forms of construction in accordance with the invention for the stirring elements of horizontally operated reactors are, for example, plowshare, paddle, blade stirrer, spiral stirrer or, generally, stirring elements which convey the bed material both axially and radially and exhibit a close clearance W in accordance with the invention. The close clearance may be reduced by additional scrapers on the stirring element. Besides the moving stirring elements, possibilities for the reactor A, B or C also include rigid internals, such as baffles.

For the construction of reactor A, B or C for implementing the process of the invention, any material is in principle suitable if under the respective operating conditions it has the necessary mechanical strength and chemical resistance. In terms of the chemical resistance, the reactor A, B or C may consist of corresponding solid materials as well as of chemically unresistive materials (pressure-bearing) which have specific coatings or platings on parts that are in media contact.

These materials are selected, in accordance with the invention, from the group containing:

metallic materials which correspond (according to DIN CEN ISO/TR 15608) for steels to material groups 1 to 11, for nickel and nickel alloys to groups 31 to 38, for titanium and titanium alloys to groups 51 to 54, for zirconium and zirconium alloys to groups 61 and 62, and for cast iron to groups 71 to 76, ceramic materials comprising oxide ceramics in the single-substance system, such as, for example, aluminum oxide, magnesium oxide, zirconium oxide, titanium dioxide (capacitor material), and also multi-substance systems, such as, for example, aluminum titanate (mixed form of aluminum oxide and titanium oxide), mullite (mixed form of aluminum oxide and silicon oxide), lead zirconate titanate (piezoceramic), or dispersion ceramics such as aluminum oxide strengthened with zirconium oxide (ZTA—zirconia toughened aluminum oxide)—$Al_2O_3/ZrO_2$), non-oxide ceramics, such as, for example carbides, examples being silicon carbide and boron carbide, nitrides, examples being silicon nitride, aluminum nitride, boron nitride and titanium nitride, borides and silicides, and also mixtures thereof, and composite materials belonging to the groups of the particulate composite materials, such as, for example, cemented carbide, ceramic composites, concrete and polymer concrete, the fiber composite materials, such as, for example, glass fiber-reinforced glass, metal matrix composites (MMC), fiber cement, carbon fiber-reinforced silicon carbide, self-reinforced thermoplastics, steel-reinforced concrete, fiber-reinforced concrete, fiber-plastics composites, such as, for example, carbon fiber-reinforced plastic (CRP), glass fiber-reinforced plastic (GRP) and aramid fiber-reinforced plastic (ARP), fiber-ceramic composites (ceramic matrix composites (CMC)), the penetration composite materials, such as, for example, metal matrix composites (MMC), dispersion-strengthened aluminum alloys or dispersion-hardened nickel-chromium superalloys, the layered composite materials, such as, for example, bimetals, titanium-graphite composite, composite plates and composite tubes, glass fiber-reinforced aluminum and sandwich constructions, and the structural composite materials.

The porous particles for the process of the invention are preferably selected from the group containing amorphous carbon in the form of hard carbon, soft carbon, mesocarbon, microbeads, natural graphite or synthetic graphite, single-wall and multiwall carbon nanotubes and graphene, oxides, such as silicon dioxide, aluminum oxide, mixed silicon-aluminum oxides, magnesium oxide, lead oxides and zirconium oxide, carbides such as silicon carbides and boron carbides, nitrides such as silicon nitrides and boron nitrides; and other ceramic materials, as may be described by the following component formula:

$Al_aB_bC_cMg_dN_eO_fSi_g$ with $0 \leq a$, b, c, d, e, f, $g \leq 1$, with at least two coefficients a to $g > 0$ and $a*3+b*3+c*4+d*2+g*4^3e*3+f*2$.

The ceramic materials may for example be binary, ternary, quaternary, quinary, senary or septernary compounds. Preferred ceramic materials are those having the following component formulas:

nonstoichiometric boron nitrides $BN_z$ with z=0.2 to 1,
nonstoichiometric carbon nitrides $CN_z$ with z=0.1 to 4/3,
boron carbonitrides $B_xCN_z$ with x=0.1 to 20 and z=0.1 to 20, where $x*3+4^3$ $z*3$,
boron nitridooxides $BN_zO_r$ with z=0.1 to 1 and r=0.1 to 1, where $3^3$ $r*2+z*3$,
boron carbonitride oxides $B_xCN_zO_r$ with x=0.1 to 2, z=0.1 to 1 and r=0.1 to 1, where: $x*3+4^3$ $r*2+z*3$,
silicon carboxides $Si_xCO_z$ with x=0.1 to 2 and z=0.1 to 2, where $x*4+4^3$ $z*2$,
silicon carbonitrides $Si_xCN_z$ with x=0.1 to 3 and z=0.1 to 4, where $x*4+4^3$ $z*3$,
silicon borocarbonitrides $Si_wB_xCN_z$ with w=0.1 to 3, x=0.1 to 2 and z=0.1 to 4, where $w*4+x*3+4^3$ $z*3$,
silicon borocarboxides $Si_wB_xCO_z$ with w=0.10 to 3, x=0.1 to 2 and z=0.1 to 4, where $w*4+x*3+4^3$ $z*2$,
silicon borocarbonitridooxides $Si_vB_wCN_xO_z$ with v=0.1 to 3, w=0.1 to 2, x=0.1 to 4 and z=0.1 to 3, where $v*4+w*3+4^3$ $x*3+z*2$, and
aluminum borosilicocarbonitridooxides $Al_uB_vSi_xCN_wO_z$ with u=0.1 to 2, v=0.1 to 2, w=0.1 to 4, x=0.1 to 2 and z=0.1 to 3, where $u*3+v*3+x*4+4^3$ $w*3+z*2$.

The porous particles preferably possess a density, determined by helium pycnometry, of 0.1 to 7 $g/cm^3$ and more preferably of 0.3 to 3 $g/cm^3$. This is advantageous for increasing the volumetric capacity ($mAh/cm^3$) of lithium-ion batteries.

Preferred porous particles employed are amorphous carbons, silicon dioxide, boron nitride, silicon carbide and also silicon nitride, or else mixed materials based on these materials, with particular preference being given to the use of amorphous carbons, boron nitride and silicon dioxide.

The porous particles have a volume-weighted particle size distribution with diameter percentiles $d_{50}$ of preferably ≥0.5 µm, more preferably ≥1.5 µm and most preferably ≥2 µm. The diameter percentiles $d_{50}$ are preferably ≤20 µm, more preferably ≤12 µm and most preferably ≤8 µm.

The volume-weighted particle size distribution of the porous particles is preferably between the diameter percentiles $d_{10}$≥0.2 µm and $d_{90}$≤20.0 µm, more preferably between $d_{10}$≥0.4 µm and $d_{90}$≤15.0 µm, and most preferably between $d_{10}$≥0.6 µm to $d_{90}$≤12.0 µm.

The porous particles have a volume-weighted particle size distribution with diameter percentiles $d_{10}$ of preferably ≤10 µm, more preferably <5 µm, especially preferably ≤3 µm and most preferably ≤2 µm. The diameter percentiles $d_{10}$ are preferably ≥0.2 µm, more preferably ≥0.5 and most preferably ≥1 µm.

The porous particles have a volume-weighted particle size distribution with diameter percentiles $d_{90}$ of preferably ≥4 µm and more preferably ≥8 µm. The diameter percentiles $d_{90}$ are preferably ≤18 µm, more preferably ≤15 and most preferably ≤13 µm.

The volume-weighted particle size distribution of the porous particles has a span $d_{90}-d_{10}$ of preferably ≤15.0 µm, more preferably ≤12.0 µm, very preferably ≤10.0 µm, especially preferably ≤8.0 µm, and most preferably ≤4.0 µm.

The volume-weighted particle size distribution of the silicon-containing materials producible by the process of the invention has a span $d_{90}-d_{10}$ of preferably ≥0.6 µm, more preferably ≥0.8 µm and most preferably ≥1.0 µm.

The volume-weighted particle size distribution of the porous particles can be determined according to ISO 13320 by means of static laser scattering using the Mie model with the measuring instrument Horiba LA 950, with ethanol as dispersing medium for the porous particles.

The porous particles are preferably present in the form of singulated particles. The particles may for example be isolated or agglomerated. The porous particles are preferably not aggregated and preferably not agglomerated. Aggregated means generally that in the course of the production of the porous particles, initially primary particles are formed and undergo fusion, and/or primary particles are linked to one another via covalent bonds, for example, and in this way form aggregates. Primary particles are generally isolated particles. Aggregates or isolated particles can form agglomerates. Agglomerates are a loose coalition of aggregates or primary particles, which are linked to one another for example via Van der Waals interactions or hydrogen bonds. Agglomerated aggregates can easily be split back into aggregates by conventional kneading and dispersing techniques. Aggregates cannot be disintegrated, or can be disintegrated only partly, into the primary particles by these techniques. The presence of the porous particles in the form of aggregates, agglomerates or isolated particles can be made visible, for example, by conventional scanning electron microscopy (SEM). Static light scattering methods for determining the particle size distributions or particle diameters of matrix particles are unable, in contrast, to distinguish between aggregates or agglomerates.

The porous particles may have any desired morphology, and may therefore, for example, be splintery, platy, spherical or else acicular, with splintery or spherical particles being preferred. The morphology can be characterized, for example, by the sphericity ψ or the sphericity S. According to the definition by Wadell, the sphericity ψ is the ratio of the surface area of a sphere of equal volume to the actual surface area of a body. In the case of a sphere, the value of ψ is 1. According to this definition, the porous particles for the process of the invention have a sphericity ψ of preferably 0.3 to 1.0, more preferably of 0.5 to 1.0 and most preferably of 0.65 to 1.0.

The sphericity S is the ratio of the circumference of an equivalent circle with the same area A as the projection of the particle projected onto a surface, to the measured circumference U of this projection: $S=2\sqrt{\pi A}/U$. In the case of a particle of ideal circularity, the value of S would be 1. For the porous particles for the process of the invention, the sphericity S is in the range from preferably 0.5 to 1.0 and more preferably from 0.65 to 1.0, based on the percentiles $S_{10}$ to $S_{90}$ of the numerical sphericity distribution. The sphericity S is measured, for example, from optical micrographs of individual particles or preferably, in the case of particles <10 µm, with a scanning electron microscope, by graphic evaluation by means of image analysis software, such as ImageJ, for example.

The porous particles preferably have a gas-accessible pore volume of ≥0.2 $cm^3/g$, more preferably ≥0.6 $cm^3/g$ and most preferably ≥1.0 $cm^3/g$. This is useful for obtaining lithium-ion batteries with a high capacity. The gas-accessible pore volume was determined by gas sorption measurements with nitrogen in accordance with DIN 66134.

The porous particles are preferably open-pore. Open-pore means generally that pores are connected to the surface of particles, via channels, for example, and can preferably be in mass transfer, especially in transfer of gaseous compounds, with the surroundings. This can be verified using gas sorption measurements (evaluation according to Brunauer, Emmett and Teller, "BET"), i.e., of the specific surface area. The porous particles have specific surface areas of preferably ≥50 $m^2/g$, more preferably of ≥500 $m^2/g$ and most preferably ≥1000 $m^2/g$. The BET surface area is determined according to DIN 66131 (with nitrogen).

The pores of the porous particles may have any desired diameters, i.e., generally, in the range of macropores (above 50 nm), mesopores (2-50 nm) and micropores (less than 2 nm). The porous particles can be used in any desired mixtures of different pore types. Preference is given to using porous particles having less than 30% of macropores, based on the total pore volume, more preferably porous particles without macropores, and very preferably porous particles with at least 50% of pores having a mean pore diameter of less than 5 nm. With very particular preference, the porous particles comprise exclusively pores having a pore diameter of less than 2 nm (method of determination: pore size distribution by BJH (gas adsorption) according to DIN 66134 in the mesopore range and according to Horvath-Kawazoe (gas adsorption) according to DIN 66135 in the micropore range; the evaluation of the pore size distribution in the macropore range is made by mercury porosimetry in accordance with DIN ISO 15901-1).

Preferred porous particles are those having a gas-inaccessible pore volume of less than 0.3 $cm^3/g$ and more preferably less than 0.15 $cm^3/g$. In this way as well it is possible to increase the capacity of the lithium-ion batteries. The gas-inaccessible pore volume may be determined by means of the following formula:

$$gas-inaccessible\ pore\ volume = 1/pure-material - 1/skeletal\ density.$$

The pure-material density here is a theoretical density of the porous particles, based on the phase composition or the density of the pure material (the density of the material as if it had no closed porosity). Data on pure-material densities can be found by the skilled person in, for example, the Ceramic Data Portal of the National Institute of Standards (NIST, https://srdata.nist.gov/CeramicDataPortal/scd). For example, the pure-material density of silicon oxide is 2.203 $g/cm^3$, that of boron nitride is 2.25 $g/cm^3$, that of silicon nitride is 3.44 $g/cm^3$, and that of silicon carbide is 3.21 $g/cm^3$. The skeletal density is the actual density of the porous particles (gas-accessible) determined by helium pycnometry.

For clarification it may be noted that the porous particles are different from the silicon-containing material. The porous particles act as starting material for producing the silicon-containing material. Generally there is no silicon, more particularly no silicon obtained by deposition of silicon precursors, located in the pores of the porous particles and on the surface of the porous particles, preferably.

The silicon-containing material obtained by the process of the invention by means of deposition of silicon in pores and on the surface of the porous particles has a volume-weighted particle size distribution with diameter percentiles $d_{50}$ preferably in a range from 0.5 to 20 μm. The $d_{50}$ value is preferably at least 1.5 μm, and more preferably at least 2 μm. The diameter percentiles $d_{50}$ are preferably at most 13 μm and more preferably at most 8 μm.

The volume-weighted particle size distribution of the silicon-containing material is situated preferably between the diameter percentiles $d_{10} \geq 0.2$ μm and $d_{90} \leq 20.0$ μm, more preferably between $d_{10} \geq 0.4$ μm and $d_{90} \leq 15.0$ μm, and most preferably between $d_{10} \geq 0.6$ μm to $d_{90} \leq 12.0$ μm.

The silicon-containing material has a volume-weighted particle size distribution with diameter percentiles $d_{10}$ of preferably $\leq 10$ μm, more preferably $\leq 5$ μm, especially preferably $\leq 3$ μm and most preferably $\leq 1$ μm. The diameter percentiles $d_{10}$ are preferably $\geq 0.2$ μm, more preferably $\geq 0.4$ μm and most preferably $\geq 0.6$ μm.

The silicon-containing material has a volume-weighted particle size distribution with diameter percentiles $d_{00}$ of preferably $\geq 5$ μm and more preferably $\geq 10$ μm. The diameter percentiles $d_{90}$ are preferably $\leq 20$ μm, more preferably $\leq 15$ μm and most preferably $\leq 12$ μm.

The volume-weighted particle size distribution of the silicon-containing material has a span $d_{90}-d_{10}$ of preferably $\leq 15.0$ μm, more preferably $\leq 12.0$ μm, more preferably $\leq 10.0$ μm, especially preferably $\leq 8.0$ μm, and most preferably $\leq 4.0$ μm. The volume-weighted particle size distribution of the silicon-containing material has a span $d_{90}-d_{10}$ of preferably $\geq 0.6$ μm, more preferably $\geq 0.8$ μm and most preferably $\geq 1.0$ μm.

The particles of the silicon-containing material are preferably in the form of particles. The particles may be isolated or agglomerated. The silicon-containing material is preferably not aggregated and preferably not agglomerated. The terms isolated, agglomerated and unaggregated have already been defined earlier on above in relation to the porous particles. The presence of silicon-containing materials in the form of aggregates or agglomerates may be made visible, for example, by means of conventional scanning electron microscopy (SEM).

The silicon-containing material may have any desired morphology, and may therefore, for example, be splintery, platy, spherical or else acicular, with splintery or spherical particles being preferred.

According to the definition of Wadell, the sphericity $\psi$ is the ratio of the surface area of a sphere of equal volume to the actual surface area of a body. In the case of a sphere, the value of $\psi$ is 1. According to this definition, the silicon-containing materials accessible by the process of the invention have a sphericity $\psi$ of preferably 0.3 to 1.0, more preferably of 0.5 to 1.0, and most preferably of 0.65 to 1.0.

The sphericity S is the ratio of the circumference of an equivalent circle with the same area A as the projection of the particle projected onto a surface, to the measured circumference U of this projection: $S=2\sqrt{\pi A}/U$. In the case of a particle of ideal circularity, the value of S would be 1. For the silicon-containing materials accessible by the process of the invention, the sphericity S is in the range from preferably 0.5 to 1.0 and more preferably from 0.65 to 1.0, based on the percentiles $S_{10}$ to $S_{90}$ of the numerical sphericity distribution. The sphericity S is measured, for example, from optical micrographs of individual particles or preferably, in the case of particles smaller than 10 μm, with a scanning electron microscope, by graphic evaluation by means of image analysis software, such as ImageJ, for example.

The cycling stability of lithium-ion batteries can be increased further via the morphology, the material composition, in particular the specific surface area or the internal porosity of the silicon-containing material.

The silicon-containing material contains preferably 10 to 90 wt %, more preferably 20 to 80 wt %, very preferably 30 to 60 wt % and especially preferably 40 to 50 wt % of porous particles, based on the total weight of the silicon-containing material.

The silicon-containing material contains preferably 10 to 90 wt %, more preferably 20 to 80 wt %, very preferably 30 to 60 wt % and especially preferably 40 to 50 wt % of silicon obtained via deposition from the silicon precursor, based on the total weight of the silicon-containing material (determination preferably by elemental analysis, such as ICP-OES).

If the porous particles comprise silicon compounds, in the form of silicon dioxide, for example, the abovementioned wt % figures for the silicon obtained via deposition from the silicon precursor can be determined by subtracting the silicon mass in the porous particles, ascertained by elemental analysis, from the silicon mass in the silicon-containing material, ascertained by elemental analysis, and dividing the result by the mass of the silicon-containing material.

The volume of the silicon deposited in porous particles is a product of the mass fraction of the silicon obtained via deposition from the silicon precursor, as a proportion of the total mass of the silicon-containing material, divided by the density of silicon (2.336 g/cm$^3$).

The pore volume P of the silicon-containing materials is a product of the sum of gas-accessible and gas-inaccessible pore volume. The Gurwitsch gas-accessible pore volume of the silicon-containing material can be determined by gas sorption measurements with nitrogen in accordance with DIN 66134.

The gas-inaccessible pore volume of the silicon-containing material can be determined using the formula:

$$\text{Gas-inaccessible pore volume} = 1/\text{skeletal density} - 1/\text{pure-material density}.$$

Here, the pure-material density of a silicon-containing material is a theoretical density which can be calculated from the sum of the theoretical pure-material densities of the components contained in the silicon-containing material, multiplied by their respective weight-based percentage fraction in the overall material. Accordingly, for example, for a silicon-containing material wherein silicon is deposited on a porous particle:

> Pure-material density=theoretical pure-material density of the silicon*fraction of the silicon in wt %+theoretical pure-material density of the porous particles*fraction of the porous particles in wt %.

Data on pure-material densities can be taken by the skilled person from, for example, the Ceramic Data Portal of the National Institute of Standards (NIST, https://srdata.nist-.gov/CeramicDataPortal/scd). For example, the pure-material density of silicon oxide is 2.203 g/cm$^3$, that of boron nitride is 2.25 g/cm$^3$, that of silicon nitride is 3.44 g/cm$^3$, and that of silicon carbide is 3.21 g/cm$^3$.

The pore volume P of the silicon-containing materials is situated preferably in the range from 0 to 400 vol %, more preferably in the range from 100 to 350 vol % and especially preferably in the range from 200 to 350 vol %, based on the volume of the silicon contained in the silicon-containing material and obtained from the deposition of the silicon precursor.

The porosity contained in the silicon-containing material may be both gas-accessible and gas-inaccessible. The ratio of the volume of gas-accessible to gas-inaccessible porosity of the silicon-containing material may be situated generally in the range from 0 (no gas-accessible pores) to 1 (all pores are gas-accessible). The ratio of the volume of gas-accessible to gas-inaccessible porosity of the silicon-containing material is situated preferably in the range from 0 to 0.8, more preferably in the range from 0 to 0.3, and especially preferably from 0 to 0.1.

The pores of the silicon-containing material may have any desired diameters, being situated, for example, in the range of macropores (>50 nm), mesopores (2-50 nm) and micropores (<2 nm). The silicon-containing material may also contain any desired mixtures of different pore types. The silicon-containing material preferably contains at most 30% of macropores, based on the total pore volume, particular preference being given to a silicon-containing material without macropores, and very particular preference to a silicon-containing material having at least 50% of pores, based on the total pore volume, having a mean pore diameter of below 5 nm. With more particular preference the silicon-containing material exclusively has pores with a diameter of at most 2 nm.

The silicon-containing material comprises silicon structures which in at least one dimension have structure sizes of preferably at most 1000 nm, more preferably less than 100 nm, very preferably less than 5 nm (method of determination: scanning electron microscopy (SEM) and/or high-resolution transmission electron microscopy (HR-TEM)).

The silicon-containing material preferably comprises silicon layers having a layer thickness of below 1000 nm, more preferably less than 100 nm, very preferably less than 5 nm (method of determination: scanning electron microscopy (SEM) and/or high-resolution transmission electron microscopy (HR-TEM)). The silicon-containing material may also comprise silicon in the form of particles. The silicon particles have a diameter of preferably at most 1000 nm, more preferably less than 100 nm, very preferably less than 5 nm (method of determination: scanning electron microscopy (SEM) and/or high-resolution transmission electron microscopy (HR-TEM)). The figure for the silicon particles here is based preferably on the diameter of the circle around the particles in the microscope image.

The silicon-containing material preferably has a specific surface area of at most 100 m$^2$/g, more preferably less than 30 m$^2$/g, and especially preferably less than 10 m$^2$/g. The BET surface area is determined according to DIN 66131 (with nitrogen). Accordingly, when the silicon-containing material is used as active material in anodes for lithium-ion batteries, SEI formation can be reduced and the initial Coulomb efficiency can be enhanced.

The silicon in the silicon-containing material, deposited from the silicon precursor, may further comprise dopants, selected for example from the group containing Li, Fc, Al, Cu, Ca, K, Na, S, Cl, Zr, Ti, Pt, Ni, Cr, Sn, Mg, Ag, Co, Zn, B, P, Sb, Pb, Ge, Bi, rare earths, or combinations thereof. Preference here is given to lithium and/or tin. The amount of dopants in the silicon-containing material is preferably at most 1 wt % and more preferably at most 100 ppm, based on the total weight of the silicon-containing material, determinable by means of ICP-OES.

The silicon-containing material generally has a surprisingly high stability under compressive and/or shearing load. The pressure stability and the shear stability of the silicon-containing material are manifested, for example, by the absence or virtual absence of changes in the porous structure of the silicon-containing material in the SEM under compressive load (for example, on electrode compaction) and, respectively, shearing load (for example, on preparation of the electrodes).

The silicon-containing material may optionally further comprise elements, such as carbon. Carbon is present preferably in the form of thin layers having a layer thickness of at most 1 μm, preferably less than 100 nm, more preferably less than 5 nm, and very preferably less than 1 nm (determinable via SEM or HR-TEM). These carbon layers may be present both in the pores and on the surface of the silicon-containing material. The sequence of different layers in the silicon-containing material through corresponding repetitions of the alternate metering of different precursors, and also their number, are also arbitrary. Accordingly, there may first be a layer, on the porous particles, of a further material, different from the porous particles, such as carbon, for example, and that layer may bear a silicon layer or a layer of silicon particles. Also possible is the presence, on the silicon layer or on the layer of silicon particles, of a layer, in turn, of a further material, which may be different from or the same as the material of the porous particles, irrespective of whether, between the porous particles and the silicon layer or the layer consisting of silicon particles, there is a further layer of a material different from the material of the porous particles.

The silicon-containing material contains preferably ≤50 wt %, more preferably ≤40 wt % and especially preferably ≤20 wt % of additional elements. The silicon-containing material contains preferably ≥1 wt %, more preferably ≥3 wt % and especially preferably ≥2 wt % of additional elements. The figures in wt % are based on the total weight of the silicon-containing material. In an alternative embodiment, the silicon-containing material contains no additional elements.

A further subject of the invention is the use of the silicon-containing material as an active material in anode materials for anodes of lithium-ion batteries, and also the use of such anodes for producing lithium-ion batteries.

The anode material is based preferably on a mixture comprising the silicon-containing material accessible by the process of the invention, one or more binders, optionally graphite as further active material, optionally one or more further electrically conducting components, and optionally one or more additives.

Through the use of further electrically conducting components in the anode material it is possible to reduce the contact resistances within the electrode and also between electrode and current collector, thereby improving the current-carrying capacity of the lithium-ion battery of the invention. Examples of preferred further electrically conducting components are conductive carbon black, carbon nanotubes or metallic particles, such as copper, for example.

The anode material comprises preferably 0 to 95 wt %, more preferably 0 to 40 wt % and most preferably 0 to 25 wt % of one or more further electrically conducting components, based on the total weight of the anode material.

In the anodes for lithium-ion batteries, the silicon-containing material may be present at preferably 5 to 100 wt %, more preferably 30 to 100 wt % and most preferably 60 to 100 wt %, based on the total active material present in the anode material.

Preferred binders are polyacrylic acid or the alkali metal salts thereof, more particularly lithium salts or sodium salts, polyvinyl alcohols, cellulose or cellulose derivatives, polyvinylidene fluoride, polytetrafluoroethylene, polyolefins, polyimides, especially polyamideimides, or thermoplastic elastomers, especially ethylene-propylene-diene terpolymers. Particularly preferred also are the alkali metal salts, especially lithium salts or sodium salts, of the aforesaid binders. All or preferably a proportion of the acid groups of a binder may be present in the form of salts. The binders have a molar mass of preferably 100 000 to 1 000 000 g/mol. Mixtures of two or more binders may also be used.

As graphite it is possible generally to use natural or synthetic graphite. The graphite particles preferably have a volume-weighted particle size distribution between the diameter percentiles $d_{10}$>0.2 μm and $d_{90}$<200 μm.

Examples of additives are pore formers, dispersants, flow control agents or dopants, an example being elemental lithium.

Preferred formulations for the anode material comprise preferably 5 to 95 wt % of the silicon-containing material, 0 to 90 wt % of further electrically conducting components, 0 to 90 wt % of graphite, 0 to 25 wt % of binders and 0 to 80 wt % of additives, with the figures in wt % being based on the total weight of the anode material and with the fractions of all the constituents of the anode material adding up to a sum of 100 wt %.

The constituents of the anode material making up an anode ink or anode paste are processed preferably in a solvent, preferably selected from the group encompassing water, hexane, toluene, tetrahydrofuran, N-methylpyrrolidone, N-ethylpyrrolidone, acetone, ethyl acetate, dimethyl sulfoxide, dimethylacetamide and ethanol, and also mixtures of these solvents, preferably using rotor-stator machines, high-energy mills, planetary kneaders, stirred ball mills, shaking plates or ultrasonic apparatuses.

The anode ink or anode paste has a pH of preferably 2 to 8.5 (determined at 20° C., using, for example, the WTW pH 340i PH meter with SenTix RJD probe).

The anode ink or anode paste can be applied by doctor blade, for example, to a copper foil or another current collector. Other coating methods, such as rotational coating (spin coating), roller coating, dipping or slot-die coating, painting or spraying, for example, may also be used in accordance with the invention.

Before the copper foil is coated with the anode material of the invention, the copper foil may undergo treatment with a commercial primer, based for example on polymer resins or silanes. Primers can lead to an improvement in the adhesion to the copper, but themselves generally possess virtually no electrochemical activity.

The anode material is generally dried to constant weight. The drying temperature is guided by the components used and by the solvent employed. It is situated preferably between 2° and 300° C. The layer thickness, meaning the dry layer thickness of the anode coating, is preferably 2 to 500 μm.

Lastly, the electrode coatings may be calendered, in order to set a defined porosity. The electrodes thus produced preferably have porosities of 15 to 85%, which can be determined via mercury porosimetry in accordance with DIN ISO 15901-1. Here, preferably 25 to 85% of the pore volume which can be determined in this way is provided by pores which have a pore diameter of 0.01 to 2 μm.

A further subject of the invention are lithium-ion batteries comprising a cathode, an anode which comprises the etched silicon-containing material, two electrically conducting connections to the electrodes, a separator, and an electrolyte, with which the separator and the two electrodes are impregnated, and also a casing accommodating the stated components.

In the context of this invention, the term lithium-ion battery also encompasses cells. Cells generally comprise a cathode, an anode, a separator and an electrolyte. Besides one or more cells, lithium-ion batteries preferably further comprise a battery management system. Battery management systems serve generally to control batteries, by means of electronic circuits, for example, especially for recognizing the charge state, for protection from exhaustive discharge, or for protection against overcharging.

Preferred cathode materials which can be used in accordance with the invention include lithium cobalt oxide, lithium nickel oxide, lithium nickel cobalt oxide (doped or undoped), lithium manganese oxide (spinel), lithium nickel cobalt manganese oxides, lithium nickel manganese oxides, lithium iron phosphate, lithium cobalt phosphate, lithium manganese phosphate, lithium vanadium phosphate, or lithium vanadium oxides.

The separator is generally an electrically insulating, ion-permeable membrane, preferably made of polyolefins, for example polyethylene (PE) or polypropylene (PP), or polyester, or corresponding laminates. Alternatively, as is customary within battery manufacture, the separator may consist of or be coated with glass or ceramic materials. The separator, conventionally, separates the first electrode from the second electrode and therefore prevents electronically conducting connections between the electrodes (short circuiting).

The electrolyte is preferably a solution comprising one or more lithium salts (=conductive salt) in an aprotic solvent. Conductive salts are preferably selected from the group containing lithium hexafluorophosphate, lithium hexafluoroarsenate, lithium perchlorate, lithium tetrafluoroborate, lithium imides, lithium methides, lithium trifluoromethanesulfonate $LiCF_3SO_3$, lithium bis(trifluoromethanesulfonimide) $LiN(CF_3SO_2)_2$ and lithium borates. The concentration of the conductive salt, based on the solvent, is preferably between 0.5 mol/l and the solubility limit of the salt in question. More preferably it is 0.8 to 1.2 mol/l.

Solvents used are preferably cyclic carbonates, propylene carbonate, ethylene carbonate, fluoroethylene carbonate, dimethyl carbonate, diethyl carbonate, ethyl methyl carbonate, dimethoxyethane, diethoxyethane, tetrahydrofuran, 2-methyltetrahydrofuran, gamma-butyrolactone, dioxolane, acetonitrile, organic esters of carbonic acid, or nitriles, individually or as mixtures thereof.

The electrolyte preferably comprises a film former, such as vinylene carbonate or fluoroethylene carbonate, for example. In this way it is possible to achieve a significant improvement in the cycling stability of the anodes comprising the etched silicon-containing material obtained according to the process of the invention. This improvement is ascribed primarily to the formation of a solid electrolyte interphase on the surface of active particles. The fraction of the film former in the electrolyte is preferably between 0.1 and 20.0 wt %. In order to match the actual capacities of the electrodes of a lithium-ion cell to one another in as optimal a way as possible, it is advantageous to balance out, in terms of absolute capacity, the materials for the positive and negative electrodes. Of particular importance in this context is the fact that, in the first or initial charging/discharging cycle of secondary lithium-ion cells (known as activation), a covering layer is formed on the surface of the electrochemically active materials in the anode. This covering layer is referred to as a solid electrolyte interphase (SEI) and consists in general mainly of electrolyte decomposition products and also a certain amount of lithium, which is accordingly no longer available for further charging/discharging reactions. The thickness and composition of the SEI are dependent on the nature and the quality of the anode material used and of the electrolyte solution used.

In the case of graphite, the SEI is particularly thin. On graphite there is a loss of typically 5 to 35% of the mobile lithium in the first charging step. There is also, correspondingly, a drop in the reversible capacity of the battery.

In the case of anodes with the etched silicon-containing active material obtained by the process of the invention, the first charging step is accompanied by a loss of mobile lithium of preferably at most 30%, more preferably at most 20% and most preferably at most 10%, which is well below the values described in the prior art, such as in U.S. Pat. No. 10,147,950 B1, for example.

All substances and materials utilized for the production of such lithium-ion batteries as described above are known. Production of the parts of such batteries, and their assembly to give batteries, take place in accordance with the processes known within the field of battery manufacture.

The silicon-containing material obtained by the process of the invention is notable for significantly improved electrochemical characteristics, and leads to lithium-ion batteries having high volumetric capacities and outstanding performance properties. The silicon-containing material obtained by the process of the invention is permeable to lithium ions and also electrons, and therefore allows charged transport. The SEI in lithium-ion batteries can be reduced to a large extent with the silicon-containing material obtained by the process of the invention. In addition, because of the design of the silicon-containing material obtained with the process of the invention, there is no longer any detachment, or at least greatly reduced detachment, of the SEI from the surface of the active material. All of this results in a high cycling stability on the part of such lithium-ion batteries whose anodes contain the silicon-containing material obtainable by the process of the invention.

The examples which follow serve for further elucidation of the invention described here.

Analytical methods and instruments used for the characterization were as follows:

Inorganic Analysis/Elemental Analysis:

The C contents reported in the examples were ascertained using a Leco CS 230 analyzer; for determination of O and, where appropriate N and H contents, a Leco TCH-600 analyzer was used. The qualitative and quantitative determination of other reported elements took place by means of ICP (inductively coupled plasma) emission spectrometry (Optima 7300 DV, from Perkin Elmer). For this analysis, the samples were subjected to acid digestion ($HF/HNO_3$) in a microwave (Microwave 3000, from Anton Paar). The ICP-OES determination is guided by ISO 11885 "Water quality—Determination of selected elements by inductively coupled plasma optical emission spectrometry (ICP-OES) (ISO 11885:2007); German version EN ISO 11885:2009", which is used for analysis of acidic, aqueous solutions (e.g., acidified samples of drinking water, wastewater and other water, aqua regia extracts of soils and sediments).

Particle Size Determination:

The particle size distribution was determined in the context of this invention according to ISO 13320 by means of static laser scattering using a Horiba LA 950. In the preparation of the samples, particular attention must be paid here to the dispersing of the particles in the measurement solution, so as not to measure the size of agglomerates rather than that of individual particles. For the measurement, the particles were dispersed in ethanol. For this purpose the dispersion, prior to the measurement, was treated as and when required with 250 W ultrasound in a Hielscher model UIS250v ultrasound laboratory instrument with LS24d5 sonotrode for 4 minutes.

BET Surface Area Measurement:

The specific surface area of the materials was measured via gas adsorption with nitrogen, using a Sorptomatic 199090 instrument (Porotec) or an SA-9603MP instrument (Horiba) by the BET method (determination according to DIN ISO 9277:2003-05 with nitrogen).

Skeletal Density:

The skeletal density, i.e., the density of the porous solid based on the volume exclusively of the pore spaces gas-accessible from the outside, was determined by means of He pycnometry in accordance with DIN 66137-2.

Gas-Accessible Pore Volume:

The Gurwitsch gas-accessible pore volume was determined by gas sorption measurements with nitrogen in accordance with DIN 66134.

Conversion:

The conversion is calculated as the quotient of the molar amount of the starting material (reactant) converted, relative to the molar amount of the starting material (reactant) employed. In these examples, it shows how many of the $SiH_4$ molecules employed are converted into Si.

$$\text{Conversion of } SiH_4 \text{ in } \% = \frac{\text{Molar amount of Si obtained}}{\text{Molar amount of } SiH_4 \text{ employed}} * 100\%$$

Yield:

The yield is the quotient of the mass of product actually obtained and the theoretical maximum possible product mass. The yield is expressed as a mass ratio quantity in percent:

$$\text{Yield in } \% = \frac{\text{Actual mass of product}}{\text{Maximum posible mass of product}} * 100\%$$

It is a metric for the losses of the particles entrained by the gas stream.

EXAMPLES

The $SiH_4$ used, of grade 4.0, was acquired from Linde GmbH.

In all of the examples, the amorphous carbon was used as porous starting material:

spec. surface area=1907 $m^2/g$
pore volume=0.96 $cm^2/g$
mean volume-weighted particle size $D_{50}$=2.95 μm
particle density=0.7 $g/cm^2$
cohesive, Geldart classification: C Reactors used in performing the experimental examples were as follows:

Reactor (Inventive):

All the inventive examples were carried out within the specific variant—the reactors A, B and C are the same vessel—of the process. The reactor used consisted of a cylindrical lower part (beaker) having an internal radius $r_B$=121.5 mm and a height h=512 mm and of a lid having multiple connections (for example, for gas supply, gas discharge, temperature measurement and pressure measurement) and of a flat base. Internals on the wall were not present. The volume of the reactor was $V_B$=24 l. The circumference of an arbitrary sectional face of the rotational face produced by rotation of the inner reactor contour about the rotational axis is calculated as 763.4 mm. The stirrer used was a multi-flight helical stirrer having a radius of $r_R$=119.5 mm. Complete revolution of the helical stirrer produces a rotational face. The circumference of an arbitrary sectional face perpendicular to the rotational axis of this rotational face is 750.8 mm. From the two circumferences, a close clearance of W=0.98 is obtained. The height of the helix corresponded to around 75% of the clear height of the reactor interior. The reactor was filled such that the height of the stirred particle bed is lower than the height of the helix. Accordingly, more than 50% of the reaction zone is in the region of the stirrer having the close clearance W=0.98. The beaker was heated electrically with a jacket heater. The temperature was measured in principle between the heater and the reactor. The gas was supplied in the lower half (125 mm above the reactor base) of the bed, via two submerged tubes having an outer diameter of d=6 mm, which introduced the gas directly into the agitated bed.

Fluidized Bed Reactor (Non-Inventive):

The fluidized bed reactor used in the non-inventive, comparative example 1 consisted of a cylindrical part having an outer diameter of 160 mm and a height of 1200 mm. The cylindrical part was composed of a bottom chamber and the fluidized bed reactor itself. The two parts were separated from each other by the gas-permeable base. The cylindrical reactor part was followed at the top by a reactor part with cross-sectional widening to twice the cross-sectional area by comparison with the cylindrical reactor part. At the top end of the reactor there was a lid with filter elements for the exit of gas. The reaction temperature was adjusted via heating of the reactor wall, with the height of the heated region being 80% of the cylindrical length beginning at the gas-permeable base. The metric utilized for the process temperature was the temperature between heating jacket and outer reactor wall. Heating was by electricity. The fluidizing gas was preheated with a gas heater accordingly, prior to gas flow into the fluidized bed reactor. The fluidizing gas stream was pulsed using a directly controlled magnetic valve. As a measure of the quality of the fluidized bed, the fluidization index was employed. In preliminary tests, the minimum fluidization velocity was determined by measuring the pressure loss of the fluidized bed.

Definition of fluidization index: The fluidization index FI is defined as the ratio of the pressure loss measured over the fluidized bed $\Delta p_{WS,measured}$ to the theoretical maximum attainable pressure loss $\Delta p_{WS,th}$ and is calculated by the following equation 1:

$$FI = \frac{\Delta p_{WS,measured}}{\Delta p_{WS,th}}$$

The theoretical maximum attainable pressure loss is calculated, disregarding the gas density, from the mass of the bed $m_S$, the acceleration due to gravity g and the reactor cross-sectional area $A_{WS}$, as $\Delta p_{WS,th}=m_S \cdot g/A_{WS}$.

In the case of a completely fluidized bed, the fluidization index adopts values of not more than 1.

Determination of the fluidization index: The fluidization index is the ratio of measured pressure loss to theoretical maximum possible pressure loss. For determining the fluidization index, it is necessary to capture the pressure loss of the fluid bed by technical measurement. The pressure loss measurement takes place as a differential pressure measurement between bottom and top ends of the fluidized bed. The differential pressure instrument converts the pressures detected on membranes into digital values and displays the pressure difference. The pressure measurement lines must be configured such that they are arranged directly above the gas-permeable base and directly above the fluidized bed. For the determination of the fluidization index, the precise capture of the weight of the particle bed introduced is necessary as well. See also [VDI-Wärmeatlas, 11th edition, section L3.2 Flow forms and pressure loss in fluidized beds, pp. 1371-1382, Springer Verlag, Berlin Heidelberg, 2013].

Determination of the minimum fluidization velocity: the minimum fluidization velocity is the fluidizing gas velocity—based on the empty reactor cross-sectional area—at which the particle bed transitions from the flow-traversed fixed bed into a fluidized bed. The minimum fluidization velocity can be determined through simultaneous measurement of the regulated fluidizing gas stream, using a mass flow meter, and of the pressure loss of the fluidized bed, using a digital differential pressure meter. Given knowledge of the cross-sectional area of the reactor, the fluidizing gas velocity can be calculated from the fluidizing gas stream measured. The plotted profile of the pressure loss against the fluidizing gas velocity is referred to as the characteristic fluidized bed line. It should be noted that the characteristic fluidized bed line is recorded, starting from a high fluidizing gas velocity, by gradual reduction of this velocity. In the case of a pure fixed bed traversing flow, the pressure loss increases linearly. The associated fluidization index FI is less than one. For a fully formed fluidized bed, the pressure loss measured is constant. The associated fluidization index FI is one. The state of minimum fluidization is situated at the transition between the two ranges. The associated fluidizing gas velocity, based on the empty reactor cross-sectional area, is equal to the minimum fluidization velocity. If the transition from the fixed bed to the fluidized bed is characterized by a range, the point of intersection of the extrapolated characteristic fixed bed line and the extrapolated characteristic fluidized bed line is defined as the point of minimum fluidization. See also [VDI-Wärmeatlas 11th edition, section L3.2 Flow forms and pressure loss in fluidized beds, pp. 1371-1382, Springer Verlag, Berlin Heidelberg, 2013].
Rotary Tube Furnace Reactor (Non-Inventive):

In the non-inventive, comparative example 2, an indirectly heated rotary tube furnace was used. This rotary tube furnace possessed a rotary tube made of quartz glass, rotatable about its longitudinal axis, having a diameter of 20 cm and a heatable volume of 30 L. The outer wall temperature of the quartz tube was utilized as a metric for the process temperature. Heating took place electrically and could be regulated through 3 zones. For the implementation of the silicon infiltration reactions, the rotary tube ought to have gastight scaling.

Comparative Example 1 (Fluidized Bed, Non-Inventive): Production of a Silicon-Containing Material in a Fluidized Bed Reactor with Pulsed Fluidizing Gas Stream 500 g of an amorphous carbon as porous starting material (specific surface area=1907 $m^2$/g, pore volume=0.96 $cm^3$/g, mean volume-weighted particle size $D_{50}$=2.95 µm, particle density=0.7 g/$cm^3$, Geldart class C particles) were introduced into the reactor.

The particle bed was fluidized with a fluidizing gas consisting of nitrogen, the quantity of gas being set for at least 3 times the minimum fluidization velocity determined in the preliminary tests. At the same time, using the magnetic valve, the gas stream was set in vibration, with the frequency between the open and closed positions of the valve being 3 Hz. The temperature in the reactor was then raised to the setpoint temperature of 430° C. Because of the rise in temperature, the fluidizing gas stream was adapted such that the fluidization index adopted a value >0.95.

On attainment of the setpoint temperature of 430° C., the fluidizing gas was replaced by reactive gas containing 10 vol % $SiH_4$. The pulsation of the gas stream with the frequency between the open and closed positions of the valve of 3 Hz was maintained during and after the switch of the fluidizing gases, and, in addition, not only the values for the fluidization index of FI=0.98 but also owing to the change in density of the porous starting materials during the deposition of the silicon, the gas quantity of the fluidizing gas were adjusted in such a way that the fluidization index values were always greater than 0.95.

After a reaction time of 2.6 hours, the fluidizing gas was switched back to a pulsed stream of nitrogen. The heating power was reduced. When a temperature of 50° C. was reached, the fluidizing gas stream was changed over to a fluidizing gas consisting of 5 vol % oxygen in nitrogen and was maintained for 60 min in order to allow for controlled reaction of any reactive groups present on the surface of the resultant product. The reactor was subsequently cooled down to room temperature.

After the ending of the operation, 990 g of a black solid were discharged from the reactor. The silicon-containing material obtained was introduced into a cylindrical vessel and homogenized in a drum hoop mixer. The agglomerates formed as a result of the fluidized bed process could be eliminated by sieving. The reaction conditions for the production and also the physical properties of the silicon-carbon composite particles are summarized in table 2.

Comparative Example 2 (Rotary Tube Furnace, Non-Inventive): Production of a Silicon-Containing Material by a Non-Inventive Process in the Rotating Tube Reactor A rotating tube reactor (internal volume 30 L) was charged with 0.9 kg of the same porous carbon as in comparative example 1 (specific surface area=1907 $m^2$/g, pore volume=0.96 $cm^3$/g, mean volume-weighted particle size $D_{50}$=2.95 µm, particle density=0.7 g/$cm^3$, Geldart class C particles). After inertization with nitrogen, the reactor was heated to 430° C. When the reaction temperature was reached, the reactive gas (10% $SiH_4$ in $N_2$, metering rate 0.4 g Si/($cm^3$*h)) was passed through the reactor for 8.5 h, during which the reactor was rotated at a speed of around 7 revolutions per minute. The reactor was subsequently purged with inert gas. Before the product was withdrawn from the reactor, it was cooled to room temperature under inert gas. The reaction conditions for the production and also the physical properties of the silicon-carbon composite particles are summarized in table 2.

Examples 1-5 (Inventive): Production of Silicon-Containing Materials by the Process of the Invention Using Monosilane $SiH_4$ as Silicon Precursor Under Standard Pressure (0.1 MPa) (the Respective Values for the Parameters A-D and Also the Example Number are Summarized in Table 1)

In phase 1 of the process, 2.4 kg of the same porous carbon as in comparative examples 1 and 2 (specific surface area=1907 $m^2$/g, pore volume=0.96 $cm^3$/g, mean volume-weighted particle size $D_{50}$=2.95 µm, particle density=0.7 g/$cm^3$, Geldart class C particles) were introduced into the reactor of the invention with the stirring mechanism (volume 24 L, diameter 25 cm). The reactor was subsequently conditioned to 350° C. for 240 minutes and inertized with nitrogen.

In phase 2, the reactor was heated to 430° C. When the reaction temperature was reached, the reactive gas with

---

--- concentration A mol % and pore volume-based metering rate B was passed for C hours through the reactor. The gas phase was supplied to the reactor, while the particle bed was circulated by a close-clearance stirring mechanism of the invention, a helical stirrer, such that the ratio of circulating time to the mean residence time of reactive component was D and the movement state of the bed could be described by Froude number 3.

In phase 3, the silicon-containing material was cooled over the course of 120 minutes to a temperature of 70° C. The reactor was subsequently purged for one hour with nitrogen, for one hour with lean air having an oxygen fraction of 5 vol %, for one hour with lean air having an oxygen fraction of 10 vol %, for one hour with lean air having an oxygen fraction of 15 vol %, and subsequently for one hour with air. Lastly, the product was withdrawn from the reactor.

the reactor system of the invention, in comparison to fluidized bed and rotary tube furnace.

Evaluation of the Silicon Composite Particles in Electrochemical Cells

Example 6: Anode Containing, as Respective Material, Silicon-Containing Material Obtained by the Process of the Invention, from Examples 1 to 5, and Silicon-Containing Material Obtained by the Non-Inventive Processes, from Comparative Examples 1 and 2, a Silicon-Containing Material Produced by the Process of the Invention, and Electrochemical Testing in a Lithium-Ion Battery of the Invention 29.71 g of polyacrylic acid (dried at 85° C. to constant weight; Sigma-Aldrich, Mw ~450 000 g/mol) and 756.60 g

TABLE 1

Test parameters for inventive examples 1 to 5

|  |  | Example number | | | | |
|---|---|---|---|---|---|---|
| Test parameter | Designation | Ex1 | Ex2 | Ex3 | Ex4 | Ex5 |
| SiH₄ conc., mol % | A | 10 | 50 | 50 | 100 | 100 |
| Metering rate, g Si/(cm³ h) | B | 0.4 | 0.4 | 1.5 | 0.4 | 0.2 |
| Reaction time Phase 2, h | C | 9.7 | 6.9 | 2.5 | 5.3 | 8.5 |
| Ratio t circulating time/t residence time | D | 0.075 | 0.015 | 0.015 | 0.007 | 0.007 |

The reaction conditions for the production and also the physical properties of the silicon-carbon composite particles are summarized in table 2 below.

of deionized water were agitated by shaker (290 l/min) for 2.5 h until the polyacrylic acid was fully dissolved. The solution was admixed in portions with lithium hydroxide

TABLE 2

|  | CEx 1* | CEx 2* | Ex 1 | Ex 2 | Ex 3 | Ex 4 | Ex 5 |
|---|---|---|---|---|---|---|---|
| Reactor type | Fluidized bed, pulsed | Rotary tube furnace | SBR | SBR | SBR | SBR | SBR |
| Amount of reactant, kg | 0.5 | 0.9 | 2.4 | 2.4 | 2.4 | 2.4 | 2.4 |
| SiH₄ conc., mol % | 10 | 10 | 10 | 50 | 50 | 100 | 100 |
| Jacket temperature Phase 2, ° C. | 430 | 430 | 430 | 430 | 430 | 430 | 430 |
| Reaction time Phase 2, h | 2.6 | 9.9 | 9.7 | 6.9 | 2.5 | 5.3 | 8.5 |
| Reactor volume, L | 20 | 30 | 24 | 24 | 24 | 24 | 24 |
| Reactor diameter, m | 0.15 | 0.20 | 0.25 | 0.25 | 0.25 | 0.25 | 0.25 |
| Fr number | n.a. | 0.005 | 3 | 3 | 3 | 3 | 3 |
| Ratio t circulating time/t residence time | n.a. | n.a. | 0.075 | 0.015 | 0.015 | 0.007 | 0.007 |
| Pore volume-based metering rate, g Si/(cm³*h) | 2.6 | 0.4 | 0.4 | 0.4 | 1.5 | 0.4 | 0.2 |
| Area-based metering rate, kg Si/(m²*h) | 70.1 | 10.8 | 18.2 | 18.2 | 68.1 | 18.2 | 9.1 |
| Conversion SiH₄, % | 20 | 40 | 41 | 60 | 40 | 75 | 98 |
| Amount of product, kg | 0.99 | 1.84 | 5.67 | 5.74 | 5.51 | 5.66 | 5.80 |
| Product yield, % | 80 | 82 | 95 | 96 | 92 | 95 | 97 |
| Particle discharge | Yes | Yes | No | No | No | No | No |
| Si, wt % | 56 | 56.5 | 56 | 57 | 55 | 56 | 57 |
| O, wt % | 3.8 | 3.04 | 2.1 | 2.64 | 3.62 | 2.64 | 2.84 |
| BET m²/g | 11 | 10 | 23 | 26.6 | 43.6 | 26.8 | 23.8 |

*Non-inventive

Equal physical characteristics were obtainable irrespective of the reactors employed. However, SiH₄ conversion, product yield and reaction time were able to be improved in monohydrate (Sigma-Aldrich) until the pH was 7.0 (measured using WTW pH 340i pH meter and SenTix RJD probe). The solution was then mixed by shaker for a further 4 h. 3.87 g of the neutralized polyacrylic acid solution and 0.96 g of graphite (Imerys, KS6L C) were placed in a 50 ml vessel and mixed in a planetary mixer (SpeedMixer, DAC 150 SP) at 2000 rpm. Subsequently, 3.35 g of each of the silicon-containing materials obtained by the process of the invention, from examples 1 to 5, and of the silicon-containing materials obtained by the non-inventive processes, from comparative examples 1 and 2, were stirred in at 2000 rpm for 1 min. Then 1.21 g of an 8 percent dispersion of conductive carbon black and 0.8 g of deionized water were added and incorporated in the planetary mixer at 2000 rpm. This was followed by dispersing in the dissolver for 30 min at 3000 rpm and at a constant 20° C. The ink was degassed again in the planetary mixer at 2500 rpm for 5 min under reduced pressure.

The completed dispersion was then applied using a film-drawing frame with a slot height of 0.1 mm (Erichsen, model 360) to a copper foil having a thickness of 0.03 mm (Schlenk Metallfolien, SE-Cu58). The anode coating thus produced was subsequently dried for 60 min at 50° C. and 1 bar air pressure. The mean surface weight of the dry anode coating was 3.0 mg/cm$^2$ and the coating density was 0.8 g/cm$^3$.

The electrochemical studies were carried out on a button cell (CR2032 type, Hohsen Corp.) in a two-electrode arrangement. The electrode coating was used as counter-electrode or negative electrode (Dm=15 mm). A coating based on lithium nickel manganese cobalt oxide 6:2:2 with a content of 94.0% and a mean basis weight of 15.9 mg/cm$^2$ (obtained from the company SEI) was used as the working electrode or positive electrode (Dm=15 mm). A glass fiber filter paper (Whatman, GD type D) impregnated with 60 μl of electrolyte served as the separator (Dm=16 mm). The electrolyte used consisted of a 1.0 molar solution of lithium hexafluorophosphate in a 1:4 (v/v) mixture of fluoroethylene carbonate and diethyl carbonate. The cell was constructed in a glovebox (<1 ppm H$_2$O, O$_2$); the water content in the dry mass of all the components used was below 20 ppm.

Electrochemical testing was carried out at 20° C. The cell was charged by the cc/cv (constant current/constant voltage) method with a constant current of 5 mA/g (corresponding to C/25) in the first cycle and of 60 mA/g (corresponding to C/2) in the subsequent cycles, and, after the voltage limit of 4.2 V had been reached, charging took place with constant voltage until the current fell below 1.2 mA/g (corresponding to C/100) or 15 mA/g (corresponding to C/8). The cell was discharged by the cc (constant current) method with a constant current of 5 mA/g (corresponding to C/25) in the first cycle and of 60 mA/g (corresponding to C/2) in the subsequent cycles, until the voltage limit of 2.5 V was reached. The specific current selected was based on the weight of the coating on the positive electrode. The electrodes were selected such as to establish a capacity ratio of cathode to anode of 1:1.2.

The results of the electrochemical testing of the full cells of lithium-ion batteries containing silicon-containing materials from inventive examples 1 to 5 and comparative examples 1 and 2 are set out in table 3.

TABLE 3

| Example number | Reversible specific capacity of negative electrode in second cycle [mAh/g] | Number of cycles with ≥80% capacity retention | Coulomb efficiency, activation [%] |
|---|---|---|---|
| CEx 1* | 1005 | 350 | 85 |
| CEx 2* | 1260 | 223 | 82 |

TABLE 3-continued

| Example number | Reversible specific capacity of negative electrode in second cycle [mAh/g] | Number of cycles with ≥80% capacity retention | Coulomb efficiency, activation [%] |
|---|---|---|---|
| Ex 1 | 1355 | 382 | 85 |
| Ex 2 | 1186 | 542 | 85 |
| Ex 3 | 1115 | 596 | 84 |
| Ex 4 | 1136 | 454 | 85 |
| Ex 5 | 1184 | 361 | 84 |

*Non-inventive

The invention claimed is:

1. A process for producing silicon-containing materials, comprising:

thermal decomposition of silicon precursors in the presence of porous particles, wherein silicon is deposited in pores and on a surface of the porous particles;

wherein the thermal decomposition of the silicon precursors takes place in a reaction zone of a gas-traversed reactor and the porous particles are circulated in the reaction zone during the thermal decomposition by using a stirring mechanism which is close-clearance in heated regions of the reaction zone;

wherein the reaction zone is the region in the reactor in which a stirred particle bed is contacted with the silicon precursors and the precursor is decomposed;

wherein the stirring mechanism is in close-clearance in accordance with equation 1

$$W(h) = \frac{u_R(h)}{u_B(h)} \tag{1}$$

wherein for half of all values of h the close clearance W(h) in the reaction zone is W(h$_{50\%}$) >0.95; and wherein u$_R$(h)=the outer circumference of the stirring mechanism in the sectional face at the height coordinate h and u$_B$(h)=the inner circumference of the reactor in the sectional face at the height coordinate h.

2. The process of claim 1, wherein the reaction zone of the reactor is rotationally symmetrical;

wherein the stirring mechanism is close-clearance if in equation 1

$$W(h) = \frac{u_R(h)}{u_B(h)} \tag{1}$$

wherein W(h)=the close clearance of a stirring mechanism in a rotationally symmetrical reactor, defined as the quotient of the circumferences of two planar sectional faces perpendicular to the rotational axis of two rotational faces;

wherein h represents the height coordinate;

wherein u$_R$(h)=the circumference of a circular inner sectional face calculated according to equation 2

$$u_R(h) = 2\pi r_R(h) \tag{2}$$

wherein at multiple arbitrary points h of the rotational face perpendicular to the rotational axis through a planar section;

wherein $r_R(h)$=the distance from the rotational axis to the the circular inner sectional face;

wherein the stirring mechanism includes all components attached thereto;

wherein $u_B(h)$=the circumference of a circular outer rotational face calculated according to equation 3

$$u_B(h) = 2\pi r_B(h) \qquad (3)$$

wherein at each arbitrary point h of the rotational face perpendicular to the rotational axis through a planar section, said rotational face being formed by rotation of the circular outer rotational face of the reactor about the rotational axis;

wherein $r_B(h)$=the distance of the circular outer rotational face of the reactor to the rotational axis; and wherein for half of all values of h the close clearance W(h) in the reaction zone must be $W(h_{50\%})$ >0.95.

3. The process of claim 1, wherein over the course of the deposition of the silicon precursor a metered addition takes place at a rate of 0.1-2 g of Si per cm$^3$ of pore volume of the porous particles used per hour.

4. The process of claim 1, wherein over the course of the deposition the silicon precursor is metered in at a rate of 1-700 kg of Si per m$^2$ of a largest flow cross-sectional area of the reactor in the reaction zone per hour, and wherein the cross-sectional area is measured for the empty reactor.

5. The process of claim 1, wherein the thermal decomposition of the silicon precursors takes place at 0.08 to 5 MPa.

6. The process of claim 1, wherein the thermal decomposition of the silicon precursors is carried out at 280 to 900° C.

7. The process of claim 1, wherein the stirred particle bed has a bed temperature in the reaction zone of the reactor equipped with the stirring mechanism is in the range from 100 to 1000° C.

8. The process of claim 1, wherein the process is carried out in a cascade reactor system comprising multiple reactors.

9. The process of claim 1, wherein the process comprises at least Phases 1 to 3;

wherein the Phase 1 comprises filling of a reactor A with the porous particles and pretreatment of the porous particles with subsequent transfer of at least a portion of the pretreated porous particles to a reactor B;

wherein the Phase 2 comprises passing of a flow of a gas consisting of an inert gas and/or at least one reactive component containing a silicon precursor and/or at least one silicon-free precursor through reactor B;

conditioning of the reactor to a temperature at which the thermal decomposition of the reactive component takes place on the surface and in the pores of the porous particles;

wherein the particle bed in reactor B is circulated with a stirring mechanism such that the movement state of the particle bed can be described with Froude numbers in the range between 1 and 10 wherein the gas phase is supplied to reactor B while the particle bed in reactor B is circulated by the stirring mechanism such that the ratio of circulating time to mean residence time of the reactive component is less than 1;

wherein after the silicon has been introduced into and onto the pores of the porous particles at least a portion of the silicon-containing materials are transferred to reactor C; and wherein the Phase 3 comprises aftertreatment of the silicon-containing particles for functionalization and/or coating of the surface of the silicon-containing particles, and cooling of the particles to a defined temperature and withdrawal of silicon-containing materials from reactor C.

* * * * *